United States Patent
Compton

(10) Patent No.: US 11,916,311 B2
(45) Date of Patent: Feb. 27, 2024

(54) ELECTRONIC DEVICES HAVING FOLDED ANTENNA MODULES

(71) Applicant: Apple Inc., Cupertino, CA (US)

(72) Inventor: Lucas R. Compton, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 90 days.

(21) Appl. No.: 17/246,290

(22) Filed: Apr. 30, 2021

(65) Prior Publication Data
US 2022/0352635 A1 Nov. 3, 2022

(51) Int. Cl.
*H01Q 9/04* (2006.01)
*H01Q 1/48* (2006.01)
(Continued)

(52) U.S. Cl.
CPC ......... *H01Q 9/0407* (2013.01); *G06F 1/1698* (2013.01); *H01Q 1/243* (2013.01);
(Continued)

(58) Field of Classification Search
CPC ........ H01Q 1/243; H01Q 1/48; H01Q 9/0407; H01Q 21/065; H05K 1/0277; H05K 1/028;
(Continued)

(56) References Cited

U.S. PATENT DOCUMENTS 6,278,413 B1 * 8/2001 Hugh .................. H01Q 1/2225
343/834

8,851,390 B2 * 10/2014 Ikemoto ............. G06K 7/10336
235/492

(Continued)

FOREIGN PATENT DOCUMENTS

EP 2973846 A1 1/2016
KR 20200078458 A 7/2020
(Continued)

OTHER PUBLICATIONS

GB Office Action dated Sep. 30, 2022, issued in GB Patent Application No. GB2205726.9 (Year: 2022).*

(Continued)

*Primary Examiner* — Ab Salam Alkassim, Jr.
*Assistant Examiner* — Leah Rosenberg
(74) *Attorney, Agent, or Firm* — Treyz Law Group, P.C.; Michael H. Lyons

(57) ABSTRACT

An electronic device may be provided with a conductive housing sidewall and a phased antenna array that conveys radio-frequency signals at frequencies greater than 10 GHz. Each antenna in the array may radiate through a respective aperture in the sidewall. The antenna module may include a folded flexible printed circuit having a first portion and a second portion that extends from an end of the first portion and that is folded with respect to the first portion. The antennas in the phased antenna array may have antenna resonating elements that are distributed between the first and second portions. Forming the antenna module from a folded flexible printed circuit in this way may serve to minimize the thickness of the antenna module, thereby allowing the antenna module to fit between a ledge of the sidewall and a rear housing wall without occupying excessive space within the device.

12 Claims, 13 Drawing Sheets

(51) Int. Cl.
*H05K 1/02* (2006.01)
*H01Q 1/24* (2006.01)
*H05K 1/03* (2006.01)
*H01Q 21/06* (2006.01)
*G06F 1/16* (2006.01)
*H05K 5/00* (2006.01)

(52) U.S. Cl.
CPC ............. *H01Q 1/48* (2013.01); *H01Q 21/065* (2013.01); *H05K 1/028* (2013.01); *H05K 1/0393* (2013.01); *H05K 5/0017* (2013.01); *H05K 2201/053* (2013.01); *H05K 2201/055* (2013.01); *H05K 2201/10098* (2013.01)

(58) Field of Classification Search
CPC ...... H05K 1/0393; H05K 1/147; H05K 1/189; H05K 2201/10098; H05K 2201/055; H05K 2201/056
See application file for complete search history.

(56) References Cited

U.S. PATENT DOCUMENTS

| | | |
|---|---|---|
| 9,450,307 B2 | 9/2016 | Petted et al. |
| 2008/0036668 A1* | 2/2008 | White ..................... H01Q 1/38 343/873 |
| 2008/0241563 A1* | 10/2008 | Thammasouk ........ H05K 3/243 156/60 |
| 2010/0190528 A1* | 7/2010 | Hsiao ................... G06K 19/077 235/382 |
| 2015/0341476 A1 | 11/2015 | Hogue et al. |
| 2016/0381784 A1* | 12/2016 | Miura ................... H05K 1/028 343/860 |
| 2018/0026341 A1 | 1/2018 | Mow et al. |
| 2018/0062263 A1* | 3/2018 | Ueda ................... H01Q 1/2283 |
| 2018/0070179 A1* | 3/2018 | McAuliffe ............. H05K 1/028 |
| 2019/0027808 A1* | 1/2019 | Mow ...................... H04R 5/04 |
| 2020/0161745 A1* | 5/2020 | Khripkov ............ H01Q 13/085 |
| 2021/0007213 A1 | 1/2021 | Ryu et al. |
| 2021/0021046 A1 | 1/2021 | Rashid et al. |
| 2021/0305679 A1* | 9/2021 | Ramm ................... H01Q 1/085 |
| 2022/0102864 A1* | 3/2022 | Morimoto ............ H05K 1/0277 |

FOREIGN PATENT DOCUMENTS

| | | | |
|---|---|---|---|
| WO | 2014164836 A1 | 10/2014 | |
| WO | 2020047460 A1 | 3/2020 | |
| WO | WO-2020250954 A1 * | 12/2020 | ............... H01Q 7/00 |

OTHER PUBLICATIONS

U.S. Appl. No. 17/098,108, filed Nov. 13, 2020.
U.S. Appl. No. 17/028,871, filed Sep. 22, 2020.
U.S. Appl. No. 17/031,775, filed Sep. 24, 2020.

* cited by examiner

ELECTRONIC DEVICES HAVING FOLDED ANTENNA MODULES

BACKGROUND

This relates generally to electronic devices and, more particularly, to electronic devices with wireless communications circuitry.

Electronic devices often include wireless communications circuitry. For example, cellular telephones, computers, and other devices often contain antennas and wireless transceivers for supporting wireless communications. It may be desirable to support wireless communications in millimeter wave and centimeter wave communications bands. Millimeter wave communications, which are sometimes referred to as extremely high frequency (EHF) communications, and centimeter wave communications involve communications at frequencies of about 10-300 GHz.

Operation at these frequencies can support high throughputs but may raise significant challenges. For example, radio-frequency signals at millimeter and centimeter wave frequencies are characterized by substantial attenuation and/or distortion during signal propagation through various mediums. In addition, if care is not taken, the antennas can be undesirably bulky and the presence of conductive electronic device components can make it difficult to incorporate circuitry for handling millimeter and centimeter wave communications into the electronic device.

It would therefore be desirable to be able to provide electronic devices with improved wireless communications circuitry such as communications circuitry that supports millimeter and centimeter wave communications.

SUMMARY

An electronic device may be provided with a housing, a display, and wireless circuitry. The housing may include peripheral conductive housing structures that run around a periphery of the device. The display may include a display cover layer mounted to the peripheral conductive housing structures. The housing may include a rear housing wall opposite the display cover layer. The wireless circuitry may include a phased antenna array that conveys radio-frequency signals at centimeter and/or millimeter wave frequencies.

Apertures may be formed in the peripheral conductive housing structures. The phased antenna array may be formed on an antenna module. The antenna module may be mounted in the housing such that each antenna in the phased antenna array radiates through a respective one of the apertures. The antenna module may be mounted to dielectric substrates in the apertures using adhesive. The antenna module may include a folded flexible printed circuit.

The flexible printed circuit may include a first portion and a second portion that extends from an end of the first portion. The second portion may be folded about an axis with respect to the first portion. The antennas in the phased antenna array may have antenna resonating elements that are distributed between the first and second portions. For example, the antennas may include ground traces in the first portion, a patch element in the second portion, and optionally a patch element in the first portion that is aligned with the patch element in the second portion. Adhesive may adhere the first portion to the second portion such that the patch elements for each antenna are laterally aligned with respect to each other and are separated by a predetermined distance.

If desired, the flexible printed circuit may have multiple folded branches with antennas in the phased antenna array. If desired, the flexible printed circuit may include additional folds for additional layers of patch elements in the antennas. Forming the antenna module from a folded flexible printed circuit in this way may serve to minimize the thickness of the antenna module, thereby allowing the antenna module to fit between a ledge of the peripheral conductive housing structures and the rear housing wall without occupying excessive space within the device.

DETAILED DESCRIPTION

Figure 1:
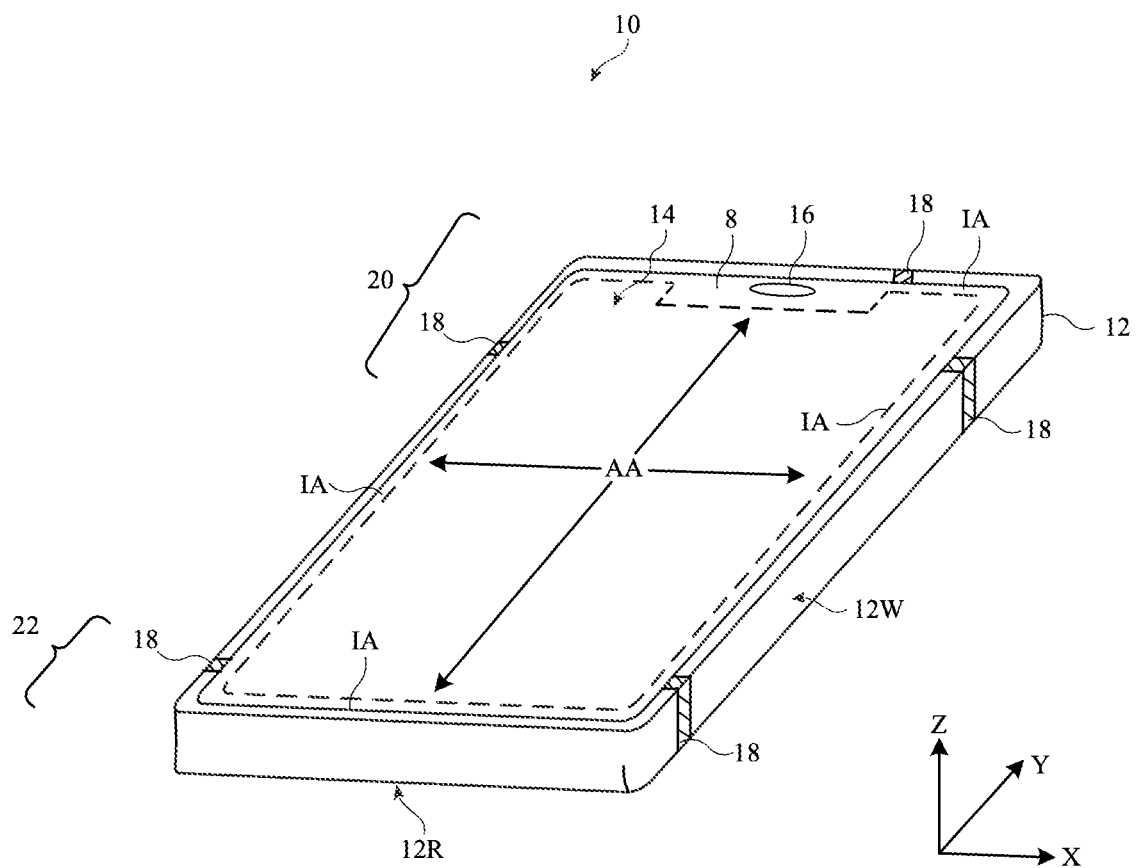
FIG. 1 is a perspective view of an illustrative electronic device in accordance with some embodiments.

An electronic device such as electronic device 10 of FIG. 1 may be provided with wireless circuitry that includes antennas. The antennas may be used to transmit and/or receive wireless radio-frequency signals. The antennas may include phased antenna arrays that are used for performing wireless communications and/or spatial ranging operations using millimeter and centimeter wave signals. Millimeter wave signals, which are sometimes referred to as extremely high frequency (EHF) signals, propagate at frequencies above about 30 GHz (e.g., at 60 GHz or other frequencies between about 30 GHz and 300 GHz). Centimeter wave signals propagate at frequencies between about 10 GHz and 30 GHz. If desired, device 10 may also contain antennas for handling satellite navigation system signals, cellular telephone signals, local wireless area network signals, near-field communications, light-based wireless communications, or other wireless communications.

Device 10 may be a portable electronic device or other suitable electronic device. For example, device 10 may be a laptop computer, a tablet computer, a somewhat smaller device such as a wrist-watch device, pendant device, headphone device, earpiece device, headset device, or other wearable or miniature device, a handheld device such as a cellular telephone, a media player, or other small portable device. Device 10 may also be a set-top box, a desktop computer, a display into which a computer or other processing circuitry has been integrated, a display without an integrated computer, a wireless access point, a wireless base station, an electronic device incorporated into a kiosk, building, or vehicle, or other suitable electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may, if desired, have a display such as display 14. Display 14 may be mounted on the front face of device 10. Display 14 may be a touch screen that incorporates capacitive touch electrodes or may be insensitive to touch. The rear face of housing 12 (i.e., the face of device 10 opposing the front face of device 10) may have a substantially planar housing wall such as rear housing wall 12R (e.g., a planar housing wall). Rear housing wall 12R may have slots that pass entirely through the rear housing wall and that therefore separate portions of housing 12 from each other. Rear housing wall 12R may include conductive portions and/or dielectric portions. If desired, rear housing wall 12R may include a planar metal layer covered by a thin layer or coating of dielectric such as glass, plastic, sapphire, or ceramic (e.g., a dielectric cover layer). Housing 12 may also have shallow grooves that do not pass entirely through housing 12. The slots and grooves may be filled with plastic or other dielectric materials. If desired, portions of housing 12 that have been separated from each other (e.g., by a through slot) may be joined by internal conductive structures (e.g., sheet metal or other metal members that bridge the slot).

Housing 12 may include peripheral housing structures such as peripheral structures 12W. Conductive portions of peripheral structures 12W and conductive portions of rear housing wall 12R may sometimes be referred to herein collectively as conductive structures of housing 12. Peripheral structures 12W may run around the periphery of device 10 and display 14. In configurations in which device 10 and display 14 have a rectangular shape with four edges, peripheral structures 12W may be implemented using peripheral housing structures that have a rectangular ring shape with four corresponding edges and that extend from rear housing wall 12R to the front face of device 10 (as an example). In other words, device 10 may have a length (e.g., measured parallel to the Y-axis), a width that is less than the length (e.g., measured parallel to the X-axis), and a height (e.g., measured parallel to the Z-axis) that is less than the width. Peripheral structures 12W or part of peripheral structures 12W may serve as a bezel for display 14 (e.g., a cosmetic trim that surrounds all four sides of display 14 and/or that helps hold display 14 to device 10) if desired. Peripheral structures 12W may, if desired, form sidewall structures for device 10 (e.g., by forming a metal band with vertical sidewalls, curved sidewalls, etc.).

Peripheral structures 12W may be formed of a conductive material such as metal and may therefore sometimes be referred to as peripheral conductive housing structures, conductive housing structures, peripheral metal structures, peripheral conductive sidewalls, peripheral conductive sidewall structures, conductive housing sidewalls, peripheral conductive housing sidewalls, sidewalls, sidewall structures, or a peripheral conductive housing member (as examples). Peripheral conductive housing structures 12W may be formed from a metal such as stainless steel, aluminum, alloys, or other suitable materials. One, two, or more than two separate structures may be used in forming peripheral conductive housing structures 12W.

It is not necessary for peripheral conductive housing structures 12W to have a uniform cross-section. For example, the top portion of peripheral conductive housing structures 12W may, if desired, have an inwardly protruding ledge that helps hold display 14 in place. The bottom portion of peripheral conductive housing structures 12W may also have an enlarged lip (e.g., in the plane of the rear surface of device 10). Peripheral conductive housing structures 12W may have substantially straight vertical sidewalls, may have sidewalls that are curved, or may have other suitable shapes. In some configurations (e.g., when peripheral conductive housing structures 12W serve as a bezel for display 14), peripheral conductive housing structures 12W may run around the lip of housing 12 (i.e., peripheral conductive housing structures 12W may cover only the edge of housing 12 that surrounds display 14 and not the rest of the sidewalls of housing 12).

Rear housing wall 12R may lie in a plane that is parallel to display 14. In configurations for device 10 in which some or all of rear housing wall 12R is formed from metal, it may be desirable to form parts of peripheral conductive housing structures 12W as integral portions of the housing structures forming rear housing wall 12R. For example, rear housing wall 12R of device 10 may include a planar metal structure and portions of peripheral conductive housing structures 12W on the sides of housing 12 may be formed as flat or curved vertically extending integral metal portions of the planar metal structure (e.g., housing structures 12R and 12W may be formed from a continuous piece of metal in a unibody configuration). Housing structures such as these may, if desired, be machined from a block of metal and/or may include multiple metal pieces that are assembled together to form housing 12. Rear housing wall 12R may have one or more, two or more, or three or more portions. Peripheral conductive housing structures 12W and/or conductive portions of rear housing wall 12R may form one or more exterior surfaces of device 10 (e.g., surfaces that are visible to a user of device 10) and/or may be implemented using internal structures that do not form exterior surfaces of device 10 (e.g., conductive housing structures that are not visible to a user of device 10 such as conductive structures that are covered with layers such as thin cosmetic layers, protective coatings, and/or other coating/cover layers that may include dielectric materials such as glass, ceramic, plastic, or other structures that form the exterior surfaces of device 10 and/or serve to hide peripheral conductive housing structures 12W and/or conductive portions of rear housing wall 12R from view of the user).

Display 14 may have an array of pixels that form an active area AA that displays images for a user of device 10. For example, active area AA may include an array of display pixels. The array of pixels may be formed from liquid crystal display (LCD) components, an array of electrophoretic pixels, an array of plasma display pixels, an array of organic light-emitting diode display pixels or other light-emitting diode pixels, an array of electrowetting display pixels, or display pixels based on other display technologies. If desired, active area AA may include touch sensors such as touch sensor capacitive electrodes, force sensors, or other sensors for gathering a user input.

Display 14 may have an inactive border region that runs along one or more of the edges of active area AA. Inactive area IA of display 14 may be free of pixels for displaying images and may overlap circuitry and other internal device structures in housing 12. To block these structures from view by a user of device 10, the underside of the display cover layer or other layers in display 14 that overlap inactive area IA may be coated with an opaque masking layer in inactive area IA. The opaque masking layer may have any suitable color. Inactive area IA may include a recessed region or notch that extends into active area AA (e.g., at speaker port 16). Active area AA may, for example, be defined by the lateral area of a display module for display 14 (e.g., a display module that includes pixel circuitry, touch sensor circuitry, etc.).

Display 14 may be protected using a display cover layer such as a layer of transparent glass, clear plastic, transparent ceramic, sapphire, or other transparent crystalline material, or other transparent layer(s). The display cover layer may have a planar shape, a convex curved profile, a shape with planar and curved portions, a layout that includes a planar main area surrounded on one or more edges with a portion that is bent out of the plane of the planar main area, or other suitable shapes. The display cover layer may cover the entire front face of device 10. In another suitable arrangement, the display cover layer may cover substantially all of the front face of device 10 or only a portion of the front face of device 10. Openings may be formed in the display cover layer. For example, an opening may be formed in the display cover layer to accommodate a button. An opening may also be formed in the display cover layer to accommodate ports such as speaker port 16 or a microphone port. Openings may be formed in housing 12 to form communications ports (e.g., an audio jack port, a digital data port, etc.) and/or audio ports for audio components such as a speaker and/or a microphone if desired.

Display 14 may include conductive structures such as an array of capacitive electrodes for a touch sensor, conductive lines for addressing pixels, driver circuits, etc. Housing 12 may include internal conductive structures such as metal frame members and a planar conductive housing member (sometimes referred to as a conductive support plate or backplate) that spans the walls of housing 12 (e.g., a substantially rectangular sheet formed from one or more metal parts that is welded or otherwise connected between opposing sides of peripheral conductive housing structures 12W). The conductive support plate may form an exterior rear surface of device 10 or may be covered by a dielectric cover layer such as a thin cosmetic layer, protective coating, and/or other coatings that may include dielectric materials such as glass, ceramic, plastic, or other structures that form the exterior surfaces of device 10 and/or serve to hide the conductive support plate from view of the user (e.g., the conductive support plate may form part of rear housing wall 12R). Device 10 may also include conductive structures such as printed circuit boards, components mounted on printed circuit boards, and other internal conductive structures. These conductive structures, which may be used in forming a ground plane in device 10, may extend under active area AA of display 14, for example.

In regions 22 and 20, openings may be formed within the conductive structures of device 10 (e.g., between peripheral conductive housing structures 12W and opposing conductive ground structures such as conductive portions of rear housing wall 12R, conductive traces on a printed circuit board, conductive electrical components in display 14, etc.). These openings, which may sometimes be referred to as gaps, may be filled with air, plastic, and/or other dielectrics and may be used in forming slot antenna resonating elements for one or more antennas in device 10, if desired.

Conductive housing structures and other conductive structures in device 10 may serve as a ground plane for the antennas in device 10. The openings in regions 22 and 20 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, may contribute to the performance of a parasitic antenna resonating element, or may otherwise serve as part of antenna structures formed in regions 22 and 20. If desired, the ground plane that is under active area AA of display 14 and/or other metal structures in device 10 may have portions that extend into parts of the ends of device 10 (e.g., the ground may extend towards the dielectric-filled openings in regions 22 and 20), thereby narrowing the slots in regions 22 and 20. Region 22 may sometimes be referred to herein as lower region 22 or lower end 22 of device 10. Region 20 may sometimes be referred to herein as upper region 20 or upper end 20 of device 10.

In general, device 10 may include any suitable number of antennas (e.g., one or more, two or more, three or more, four or more, etc.). The antennas in device 10 may be located at opposing first and second ends of an elongated device housing (e.g., at lower region 22 and/or upper region 20 of device 10 of FIG. 1), along one or more edges of a device housing, in the center of a device housing, in other suitable locations, or in one or more of these locations. The arrangement of FIG. 1 is merely illustrative.

Portions of peripheral conductive housing structures 12W may be provided with peripheral gap structures. For example, peripheral conductive housing structures 12W may be provided with one or more dielectric-filled gaps such as gaps 18, as shown in FIG. 1. The gaps in peripheral conductive housing structures 12W may be filled with dielectric such as polymer, ceramic, glass, air, other dielectric materials, or combinations of these materials. Gaps 18 may divide peripheral conductive housing structures 12W into one or more peripheral conductive segments. The conductive segments that are formed in this way may form parts of antennas in device 10 if desired. Other dielectric openings may be formed in peripheral conductive housing structures 12W (e.g., dielectric openings other than gaps 18) and may serve as dielectric antenna windows for antennas mounted within the interior of device 10. Antennas within device 10 may be aligned with the dielectric antenna windows for conveying radio-frequency signals through peripheral conductive housing structures 12W. Antennas within device 10 may also be aligned with inactive area IA of display 14 for conveying radio-frequency signals through display 14.

In order to provide an end user of device 10 with as large of a display as possible (e.g., to maximize an area of the device used for displaying media, running applications, etc.), it may be desirable to increase the amount of area at the front face of device 10 that is covered by active area AA of display 14. Increasing the size of active area AA may reduce the size of inactive area IA within device 10. This may reduce the area behind display 14 that is available for antennas within device 10. For example, active area AA of display 14 may include conductive structures that serve to block radio-frequency signals handled by antennas mounted behind active area AA from radiating through the front face of device 10. It would therefore be desirable to be able to provide antennas that occupy a small amount of space within device 10 (e.g., to allow for as large of a display active area AA as possible) while still allowing the antennas to communicate with wireless equipment external to device 10 with satisfactory efficiency bandwidth.

In a typical scenario, device 10 may have one or more upper antennas and one or more lower antennas. An upper antenna may, for example, be formed in upper region 20 of device 10. A lower antenna may, for example, be formed in lower region 22 of device 10. Additional antennas may be formed along the edges of housing 12 extending between regions 20 and 22 if desired. An example in which device 10 includes three or four upper antennas and five lower antennas is described herein as an example. The antennas may be used separately to cover identical communications bands, overlapping communications bands, or separate communications bands. The antennas may be used to implement an antenna diversity scheme or a multiple-input-multiple-output (MIMO) antenna scheme. Other antennas for covering any other desired frequencies may also be mounted at any desired locations within the interior of device 10. The example of FIG. 1 is merely illustrative. If desired, housing 12 may have other shapes (e.g., a square shape, cylindrical shape, spherical shape, combinations of these and/or different shapes, etc.).

Figure 2:
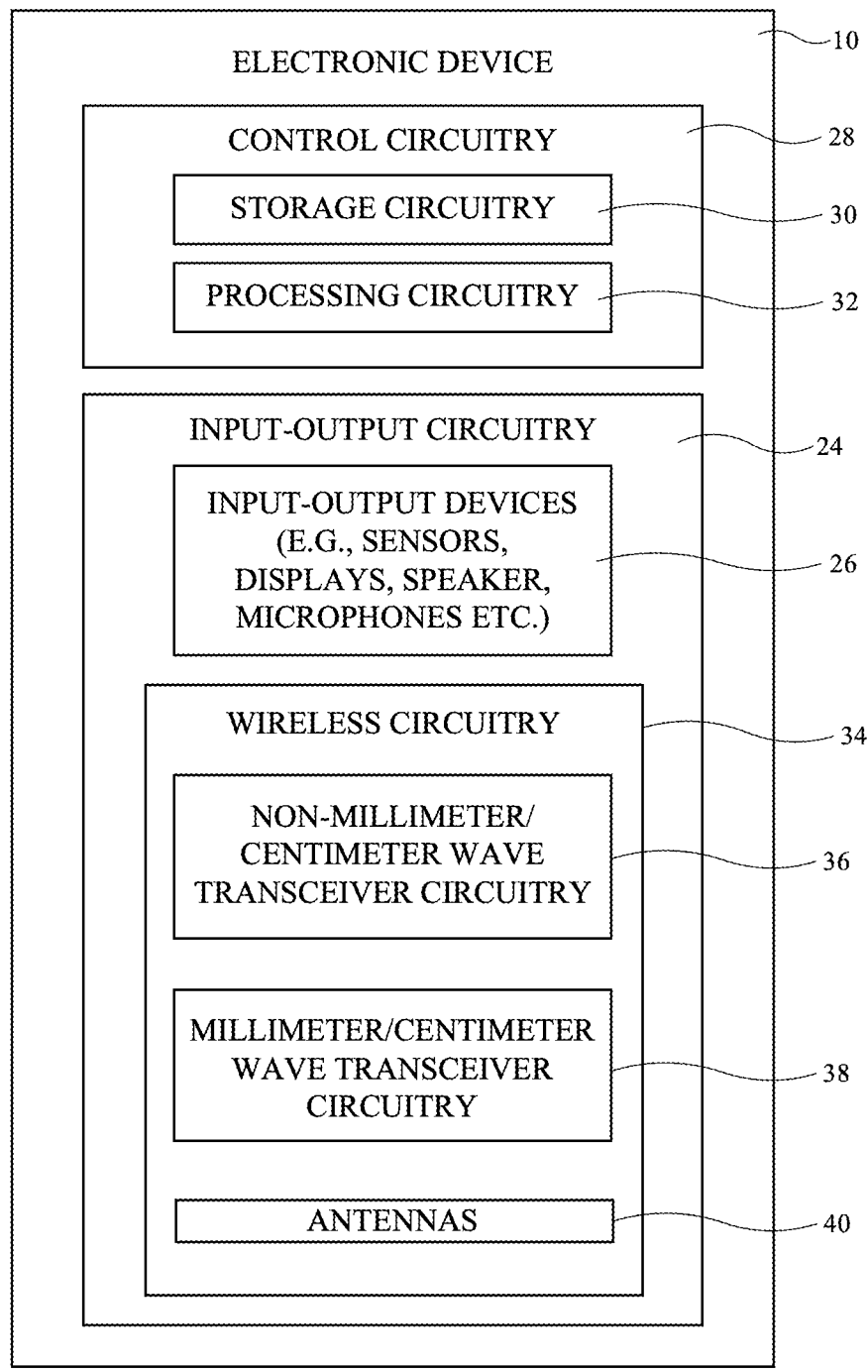
FIG. 2 is a schematic diagram of illustrative circuitry in an electronic device in accordance with some embodiments.

A schematic diagram of illustrative components that may be used in device 10 is shown in FIG. 2. As shown in FIG. 2, device 10 may include control circuitry 28. Control circuitry 28 may include storage such as storage circuitry 30. Storage circuitry 30 may include hard disk drive storage, nonvolatile memory (e.g., flash memory or other electrically-programmable-read-only memory configured to form a solid-state drive), volatile memory (e.g., static or dynamic random-access-memory), etc.

Control circuitry 28 may include processing circuitry such as processing circuitry 32. Processing circuitry 32 may be used to control the operation of device 10. Processing circuitry 32 may include on one or more microprocessors, microcontrollers, digital signal processors, host processors, baseband processor integrated circuits, application specific integrated circuits, central processing units (CPUs), etc. Control circuitry 28 may be configured to perform operations in device 10 using hardware (e.g., dedicated hardware or circuitry), firmware, and/or software. Software code for performing operations in device 10 may be stored on storage circuitry 30 (e.g., storage circuitry 30 may include non-transitory (tangible) computer readable storage media that stores the software code). The software code may sometimes be referred to as program instructions, software, data, instructions, or code. Software code stored on storage circuitry 30 may be executed by processing circuitry 32.

Control circuitry 28 may be used to run software on device 10 such as internet browsing applications, voice-over-internet-protocol (VOIP) telephone call applications, email applications, media playback applications, operating system functions, etc. To support interactions with external equipment, control circuitry 28 may be used in implementing communications protocols. Communications protocols that may be implemented using control circuitry 28 include internet protocols, wireless local area network protocols (e.g., IEEE 802.11 protocols—sometimes referred to as WiFi®), protocols for other short-range wireless communications links such as the Bluetooth® protocol or other WPAN protocols, IEEE 802.11ad protocols, cellular telephone protocols, MIMO protocols, antenna diversity protocols, satellite navigation system protocols, antenna-based spatial ranging protocols (e.g., radio detection and ranging (RADAR) protocols or other desired range detection protocols for signals conveyed at millimeter and centimeter wave frequencies), etc. Each communication protocol may be associated with a corresponding radio access technology (RAT) that specifies the physical connection methodology used in implementing the protocol.

Device 10 may include input-output circuitry 24. Input-output circuitry 24 may include input-output devices 26. Input-output devices 26 may be used to allow data to be supplied to device 10 and to allow data to be provided from device 10 to external devices. Input-output devices 26 may include user interface devices, data port devices, sensors, and other input-output components. For example, input-output devices may include touch screens, displays without touch sensor capabilities, buttons, joysticks, scrolling wheels, touch pads, key pads, keyboards, microphones, cameras, speakers, status indicators, light sources, audio jacks and other audio port components, digital data port devices, light sensors, gyroscopes, accelerometers or other components that can detect motion and device orientation relative to the Earth, capacitance sensors, proximity sensors (e.g., a capacitive proximity sensor and/or an infrared proximity sensor), magnetic sensors, and other sensors and input-output components.

Input-output circuitry 24 may include wireless circuitry such as wireless circuitry 34 for wirelessly conveying radio-frequency signals. While control circuitry 28 is shown separately from wireless circuitry 34 in the example of FIG. 2 for the sake of clarity, wireless circuitry 34 may include processing circuitry that forms a part of processing circuitry 32 and/or storage circuitry that forms a part of storage circuitry 30 of control circuitry 28 (e.g., portions of control circuitry 28 may be implemented on wireless circuitry 34). As an example, control circuitry 28 may include baseband processor circuitry or other control components that form a part of wireless circuitry 34.

Wireless circuitry 34 may include millimeter and centimeter wave transceiver circuitry such as millimeter/centimeter wave transceiver circuitry 38. Millimeter/centimeter wave transceiver circuitry 38 may support communications at frequencies between about 10 GHz and 300 GHz. For example, millimeter/centimeter wave transceiver circuitry 38 may support communications in Extremely High Frequency (EHF) or millimeter wave communications bands between about 30 GHz and 300 GHz and/or in centimeter wave communications bands between about 10 GHz and 30 GHz (sometimes referred to as Super High Frequency (SHF) bands). As examples, millimeter/centimeter wave transceiver circuitry 38 may support communications in an IEEE K communications band between about 18 GHz and 27 GHz, a $K_a$ communications band between about 26.5 GHz and 40 GHz, a $K_u$ communications band between about 12 GHz and 18 GHz, a V communications band between about 40 GHz and 75 GHz, a W communications band between about 75 GHz and 110 GHz, or any other desired frequency band between approximately 10 GHz and 300 GHz. If desired, millimeter/centimeter wave transceiver circuitry 38 may support IEEE 802.11ad communications at 60 GHz (e.g., WiGig or 60 GHz Wi-Fi bands around 57-61 GHz), and/or 5$^{th}$ generation mobile networks or 5$^{th}$ generation wireless systems (5G) New Radio (NR) Frequency Range 2 (FR2) communications bands between about 24 GHz and 90 GHz. Millimeter/centimeter wave transceiver circuitry 38 may be formed from one or more integrated circuits (e.g., multiple integrated circuits mounted on a common printed circuit in a system-in-package device, one or more integrated circuits mounted on different substrates, etc.).

Millimeter/centimeter wave transceiver circuitry 38 (sometimes referred to herein simply as transceiver circuitry 38 or millimeter/centimeter wave circuitry 38) may perform spatial ranging operations using radio-frequency signals at millimeter and/or centimeter wave frequencies that are transmitted and received by millimeter/centimeter wave transceiver circuitry 38. The received signals may be a version of the transmitted signals that have been reflected off of external objects and back towards device 10. Control circuitry 28 may process the transmitted and received signals to detect or estimate a range between device 10 and one or more external objects in the surroundings of device 10 (e.g., objects external to device 10 such as the body of a user or other persons, other devices, animals, furniture, walls, or other objects or obstacles in the vicinity of device 10). If desired, control circuitry 28 may also process the transmitted and received signals to identify a two or three-dimensional spatial location of the external objects relative to device 10.

Spatial ranging operations performed by millimeter/centimeter wave transceiver circuitry 38 are unidirectional. If desired, millimeter/centimeter wave transceiver circuitry 38 may also perform bidirectional communications with external wireless equipment such as external wireless equipment 10 (e.g., over a bi-directional millimeter/centimeter wave wireless communications link). The external wireless equipment may include other electronic devices such as electronic device 10, a wireless base station, wireless access point, a wireless accessory, or any other desired equipment that transmits and receives millimeter/centimeter wave signals. Bidirectional communications involve both the transmission of wireless data by millimeter/centimeter wave transceiver circuitry 38 and the reception of wireless data that has been transmitted by external wireless equipment. The wireless data may, for example, include data that has been encoded into corresponding data packets such as wireless data associated with a telephone call, streaming media content, internet browsing, wireless data associated with software applications running on device 10, email messages, etc.

If desired, wireless circuitry 34 may include transceiver circuitry for handling communications at frequencies below 10 GHz such as non-millimeter/centimeter wave transceiver circuitry 36. For example, non-millimeter/centimeter wave transceiver circuitry 36 may handle wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, etc.), near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest. The communications bands handled by the radio-frequency transceiver circuitry may sometimes be referred to herein as frequency bands or simply as "bands," and may span corresponding ranges of frequencies. Non-millimeter/centimeter wave transceiver circuitry 36 and millimeter/centimeter wave transceiver circuitry 38 may each include one or more integrated circuits, power amplifier circuitry, low-noise input amplifiers, passive radio-frequency components, switching circuitry, transmission line structures, and other circuitry for handling radio-frequency signals.

In general, the transceiver circuitry in wireless circuitry 34 may cover (handle) any desired frequency bands of interest. As shown in FIG. 2, wireless circuitry 34 may include antennas 40. The transceiver circuitry may convey radio-frequency signals using one or more antennas 40 (e.g., antennas 40 may convey the radio-frequency signals for the transceiver circuitry). The term "convey radio-frequency signals" as used herein means the transmission and/or reception of the radio-frequency signals (e.g., for performing unidirectional and/or bidirectional wireless communications with external wireless communications equipment). Antennas 40 may transmit the radio-frequency signals by radiating the radio-frequency signals into free space (or to freespace through intervening device structures such as a dielectric cover layer). Antennas 40 may additionally or alternatively receive the radio-frequency signals from free space (e.g., through intervening devices structures such as a dielectric cover layer). The transmission and reception of radio-frequency signals by antennas 40 each involve the excitation or resonance of antenna currents on an antenna resonating element in the antenna by the radio-frequency signals within the frequency band(s) of operation of the antenna.

In satellite navigation system links, cellular telephone links, and other long-range links, radio-frequency signals are typically used to convey data over thousands of feet or miles. In Wi-Fi® and Bluetooth® links at 2.4 and 5 GHz and other short-range wireless links, radio-frequency signals are typically used to convey data over tens or hundreds of feet. Millimeter/centimeter wave transceiver circuitry 38 may convey radio-frequency signals over short distances that travel over a line-of-sight path. To enhance signal reception for millimeter and centimeter wave communications, phased antenna arrays and beam forming (steering) techniques may be used (e.g., schemes in which antenna signal phase and/or magnitude for each antenna in an array are adjusted to perform beam steering). Antenna diversity schemes may also be used to ensure that the antennas that have become blocked or that are otherwise degraded due to the operating environment of device 10 can be switched out of use and higher-performing antennas used in their place.

Antennas 40 in wireless circuitry 34 may be formed using any suitable antenna types. For example, antennas 40 may include antennas with resonating elements that are formed from stacked patch antenna structures, loop antenna structures, patch antenna structures, inverted-F antenna structures, slot antenna structures, planar inverted-F antenna structures, monopole antenna structures, dipole antenna structures, helical antenna structures, Yagi (Yagi-Uda)

antenna structures, hybrids of these designs, etc. In another suitable arrangement, antennas 40 may include antennas with dielectric resonating elements such as dielectric resonator antennas. If desired, one or more of antennas 40 may be cavity-backed antennas. Different types of antennas may be used for different bands and combinations of bands. For example, one type of antenna may be used in forming a non-millimeter/centimeter wave wireless link for non-millimeter/centimeter wave transceiver circuitry 36 and another type of antenna may be used in conveying radio-frequency signals at millimeter and/or centimeter wave frequencies for millimeter/centimeter wave transceiver circuitry 38. Antennas 40 that are used to convey radio-frequency signals at millimeter and centimeter wave frequencies may be arranged in one or more phased antenna arrays.

Figure 3:
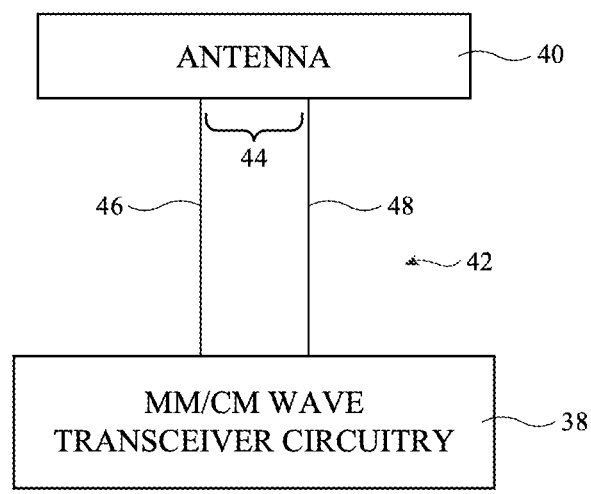
FIG. 3 is a schematic diagram of illustrative wireless circuitry in accordance with some embodiments.

A schematic diagram of an antenna 40 that may be formed in a phased antenna array for conveying radio-frequency signals at millimeter and centimeter wave frequencies is shown in FIG. 3. As shown in FIG. 3, antenna 40 may be coupled to millimeter/centimeter (MM/CM) wave transceiver circuitry 38. Millimeter/centimeter wave transceiver circuitry 38 may be coupled to antenna feed 44 of antenna 40 using a transmission line path that includes radio-frequency transmission line 42. Radio-frequency transmission line 42 may include a positive signal conductor such as signal conductor 46 and may include a ground conductor such as ground conductor 48. Ground conductor 48 may be coupled to the antenna ground for antenna 40 (e.g., over a ground antenna feed terminal of antenna feed 44 located at the antenna ground). Signal conductor 46 may be coupled to the antenna resonating element for antenna 40. For example, signal conductor 46 may be coupled to a positive antenna feed terminal of antenna feed 44 located at the antenna resonating element.

Radio-frequency transmission line 42 may include a stripline transmission line (sometimes referred to herein simply as a stripline), a coaxial cable, a coaxial probe realized by metalized vias, a microstrip transmission line, an edge-coupled microstrip transmission line, an edge-coupled stripline transmission lines, a waveguide structure, combinations of these, etc. Multiple types of transmission lines may be used to form the transmission line path that couples millimeter/centimeter wave transceiver circuitry 38 to antenna feed 44. Filter circuitry, switching circuitry, impedance matching circuitry, phase shifter circuitry, amplifier circuitry, and/or other circuitry may be interposed on radio-frequency transmission line 42, if desired.

Radio-frequency transmission lines in device 10 may be integrated into ceramic substrates, rigid printed circuit boards, and/or flexible printed circuits. In one suitable arrangement, radio-frequency transmission lines in device 10 may be integrated within multilayer laminated structures (e.g., layers of a conductive material such as copper and a dielectric material such as a resin that are laminated together without intervening adhesive) that may be folded or bent in multiple dimensions (e.g., two or three dimensions) and that maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Figure 4:
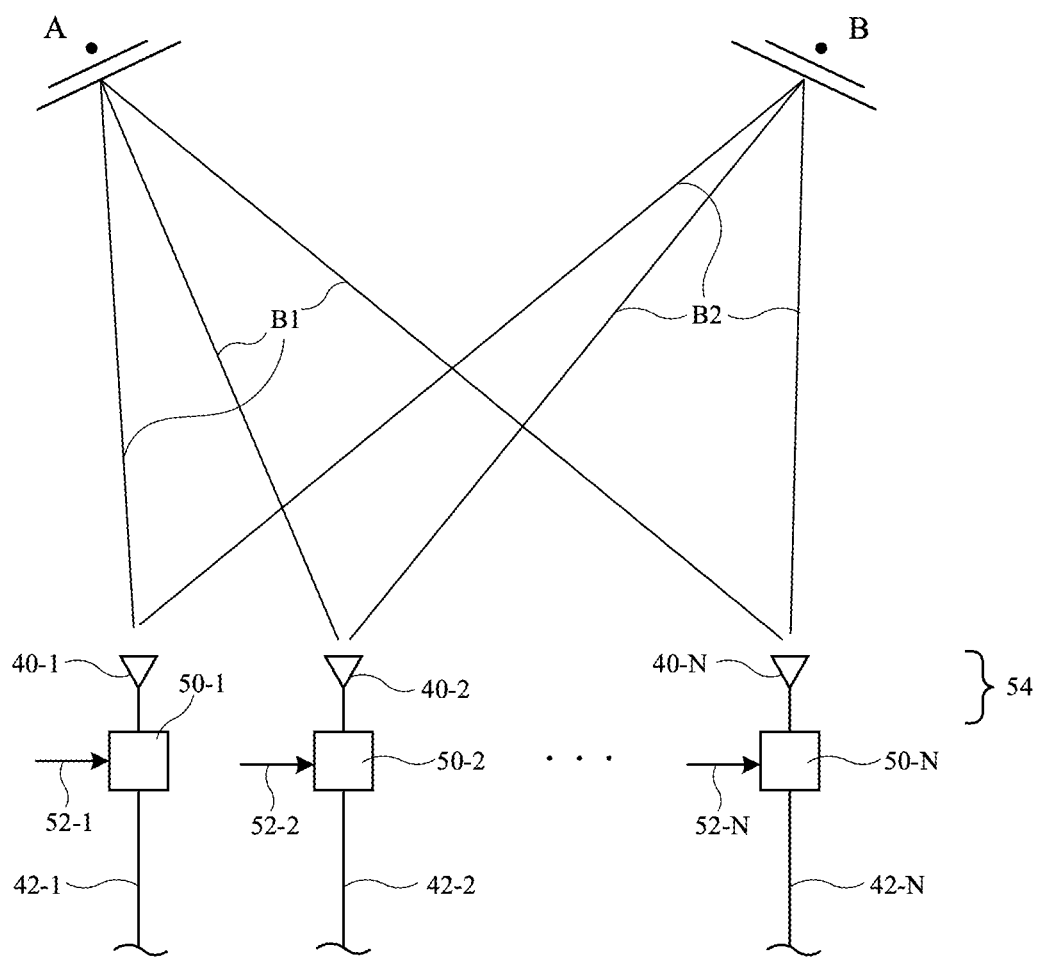
FIG. 4 is a diagram of an illustrative phased antenna array in accordance with some embodiments.

FIG. 4 shows how antennas 40 for handling radio-frequency signals at millimeter and centimeter wave frequencies may be formed in a phased antenna array. As shown in FIG. 4, phased antenna array 54 (sometimes referred to herein as array 54, antenna array 54, or array 54 of antennas 40) may be coupled to radio-frequency transmission lines 42. For example, a first antenna 40-1 in phased antenna array 54 may be coupled to a first radio-frequency transmission line 42-1, a second antenna 40-2 in phased antenna array 54 may be coupled to a second radio-frequency transmission line 42-2, an Nth antenna 40-N in phased antenna array 54 may be coupled to an Nth radio-frequency transmission line 42-N, etc. While antennas 40 are described herein as forming a phased antenna array, the antennas 40 in phased antenna array 54 may sometimes also be referred to as collectively forming a single phased array antenna.

Antennas 40 in phased antenna array 54 may be arranged in any desired number of rows and columns or in any other desired pattern (e.g., the antennas need not be arranged in a grid pattern having rows and columns). During signal transmission operations, radio-frequency transmission lines 42 may be used to supply signals (e.g., radio-frequency signals such as millimeter wave and/or centimeter wave signals) from millimeter/centimeter wave transceiver circuitry 38 (FIG. 3) to phased antenna array 54 for wireless transmission. During signal reception operations, radio-frequency transmission lines 42 may be used to supply signals received at phased antenna array 54 (e.g., from external wireless equipment or transmitted signals that have been reflected off of external objects) to millimeter/centimeter wave transceiver circuitry 38 (FIG. 3).

The use of multiple antennas 40 in phased antenna array 54 allows beam steering arrangements to be implemented by controlling the relative phases and magnitudes (amplitudes) of the radio-frequency signals conveyed by the antennas. In the example of FIG. 4, antennas 40 each have a corresponding radio-frequency phase and magnitude controller 50 (e.g., a first phase and magnitude controller 50-1 interposed on radio-frequency transmission line 42-1 may control phase and magnitude for radio-frequency signals handled by antenna 40-1, a second phase and magnitude controller 50-2 interposed on radio-frequency transmission line 42-2 may control phase and magnitude for radio-frequency signals handled by antenna 40-2, an Nth phase and magnitude controller 50-N interposed on radio-frequency transmission line 42-N may control phase and magnitude for radio-frequency signals handled by antenna 40-N, etc.).

Phase and magnitude controllers 50 may each include circuitry for adjusting the phase of the radio-frequency signals on radio-frequency transmission lines 42 (e.g., phase shifter circuits) and/or circuitry for adjusting the magnitude of the radio-frequency signals on radio-frequency transmission lines 42 (e.g., power amplifier and/or low noise amplifier circuits). Phase and magnitude controllers 50 may sometimes be referred to collectively herein as beam steering circuitry (e.g., beam steering circuitry that steers the beam of radio-frequency signals transmitted and/or received by phased antenna array 54).

Phase and magnitude controllers 50 may adjust the relative phases and/or magnitudes of the transmitted signals that are provided to each of the antennas in phased antenna array 54 and may adjust the relative phases and/or magnitudes of the received signals that are received by phased antenna array 54. Phase and magnitude controllers 50 may, if desired, include phase detection circuitry for detecting the phases of the received signals that are received by phased antenna array 54. The term "beam" or "signal beam" may be used herein to collectively refer to wireless signals that are transmitted and received by phased antenna array 54 in a particular direction. The signal beam may exhibit a peak gain that is oriented in a particular pointing direction at a corresponding pointing angle (e.g., based on constructive and destructive interference from the combination of signals from each antenna in the phased antenna array). The term "transmit beam" may sometimes be used herein to refer to radio-frequency signals that are transmitted in a particular direction whereas the term "receive beam" may sometimes be used herein to refer to radio-frequency signals that are received from a particular direction.

If, for example, phase and magnitude controllers 50 are adjusted to produce a first set of phases and/or magnitudes for transmitted radio-frequency signals, the transmitted signals will form a transmit beam as shown by beam B1 of FIG. 4 that is oriented in the direction of point A. If, however, phase and magnitude controllers 50 are adjusted to produce a second set of phases and/or magnitudes for the transmitted signals, the transmitted signals will form a transmit beam as shown by beam B2 that is oriented in the direction of point B. Similarly, if phase and magnitude controllers 50 are adjusted to produce the first set of phases and/or magnitudes, radio-frequency signals (e.g., radio-frequency signals in a receive beam) may be received from the direction of point A, as shown by beam B1. If phase and magnitude controllers 50 are adjusted to produce the second set of phases and/or magnitudes, radio-frequency signals may be received from the direction of point B, as shown by beam B2.

Each phase and magnitude controller 50 may be controlled to produce a desired phase and/or magnitude based on a corresponding control signal 52 received from control circuitry 28 of FIG. 2 (e.g., the phase and/or magnitude provided by phase and magnitude controller 50-1 may be controlled using control signal 52-1, the phase and/or magnitude provided by phase and magnitude controller 50-2 may be controlled using control signal 52-2, etc.). If desired, the control circuitry may actively adjust control signals 52 in real time to steer the transmit or receive beam in different desired directions over time. Phase and magnitude controllers 50 may provide information identifying the phase of received signals to control circuitry 28 if desired.

When performing wireless communications using radio-frequency signals at millimeter and centimeter wave frequencies, the radio-frequency signals are conveyed over a line of sight path between phased antenna array 54 and external communications equipment. If the external object is located at point A of FIG. 4, phase and magnitude controllers 50 may be adjusted to steer the signal beam towards point A (e.g., to steer the pointing direction of the signal beam towards point A). Phased antenna array 54 may transmit and receive radio-frequency signals in the direction of point A. Similarly, if the external communications equipment is located at point B, phase and magnitude controllers 50 may be adjusted to steer the signal beam towards point B (e.g., to steer the pointing direction of the signal beam towards point B). Phased antenna array 54 may transmit and receive radio-frequency signals in the direction of point B. In the example of FIG. 4, beam steering is shown as being performed over a single degree of freedom for the sake of simplicity (e.g., towards the left and right on the page of FIG. 4). However, in practice, the beam may be steered over two or more degrees of freedom (e.g., in three dimensions, into and out of the page and to the left and right on the page of FIG. 4). Phased antenna array 54 may have a corresponding field of view over which beam steering can be performed (e.g., in a hemisphere or a segment of a hemisphere over the phased antenna array). If desired, device 10 may include multiple phased antenna arrays that each face a different direction to provide coverage from multiple sides of the device.

Any desired antenna structures may be used for implementing antennas 40. In one suitable arrangement that is sometimes described herein as an example, patch antenna structures may be used for implementing antennas 40. Antennas 40 that are implemented using patch antenna structures may sometimes be referred to herein as patch antennas. An illustrative patch antenna that may be used in phased antenna array 54 of FIG. 4 is shown in FIG. 5.

Figure 5:
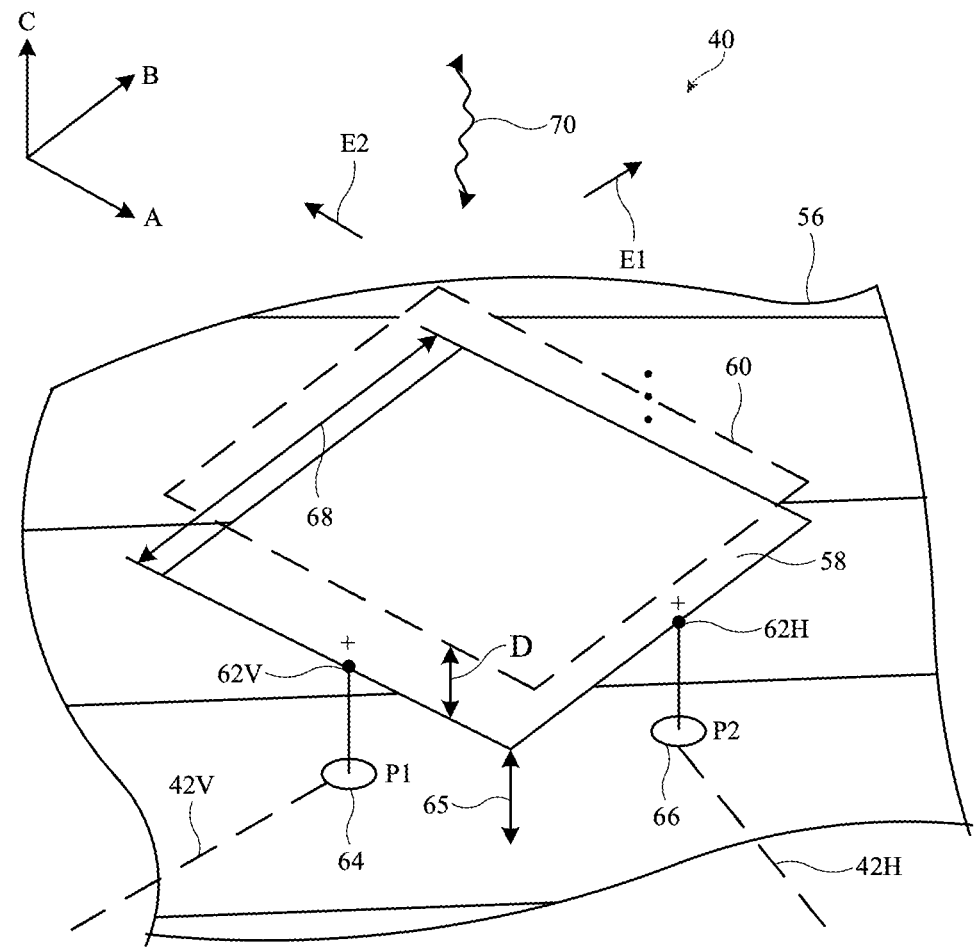
FIG. 5 is a perspective view of illustrative patch antenna structures in accordance with some embodiments.

As shown in FIG. 5, antenna 40 may have a patch antenna resonating element 58 that is separated from and parallel to a ground plane such as antenna ground 56. Patch antenna resonating element 58 may lie within a plane such as the A-B plane of FIG. 5 (e.g., the lateral surface area of element 58 may lie in the A-B plane). Patch antenna resonating element 58 may sometimes be referred to herein as patch 58, patch element 58, patch resonating element 58, antenna resonating element 58, or resonating element 58. Antenna ground 56 may lie within a plane that is parallel to the plane of patch element 58. Patch element 58 and antenna ground 56 may therefore lie in separate parallel planes that are separated by distance 65. Patch element 58 and antenna ground 56 may be formed from conductive traces patterned on a dielectric substrate such as a rigid or flexible printed circuit board substrate or any other desired conductive structures.

The length of the sides of patch element 58 may be selected so that antenna 40 resonates at a desired operating frequency. For example, the sides of patch element 58 may each have a length 68 that is approximately equal to half of the wavelength of the signals conveyed by antenna 40 (e.g., the effective wavelength given the dielectric properties of the materials surrounding patch element 58). In one suitable arrangement, length 68 may be between 0.8 mm and 1.2 mm (e.g., approximately 1.1 mm) for covering a millimeter wave frequency band between 57 GHz and 70 GHz or between 1.6 mm and 2.2 mm (e.g., approximately 1.85 mm) for covering a millimeter wave frequency band between 37 GHz and 41 GHz, as just two examples.

The example of FIG. 5 is merely illustrative. Patch element 58 may have a square shape in which all of the sides of patch element 58 are the same length or may have a different rectangular shape. Patch element 58 may be formed in other shapes having any desired number of straight and/or curved edges.

To enhance the polarizations handled by antenna 40, antenna 40 may be provided with multiple feeds. As shown in FIG. 5, antenna 40 may have a first feed at antenna port P1 that is coupled to a first radio-frequency transmission line 42 such as radio-frequency transmission line 42V. Antenna 40 may have a second feed at antenna port P2 that is coupled to a second radio-frequency transmission line 42 such as radio-frequency transmission line 42H. The first antenna feed may have a first ground feed terminal coupled to antenna ground 56 (not shown in FIG. 5 for the sake of clarity) and a first positive antenna feed terminal 62V coupled to patch element 58. The second antenna feed may have a second ground feed terminal coupled to antenna ground 56 (not shown in FIG. 5 for the sake of clarity) and a second positive antenna feed terminal 62H on patch element 58.

Holes or openings such as openings 64 and 66 may be formed in antenna ground 56. Radio-frequency transmission line 42V may include a vertical conductor (e.g., a conductive through-via, conductive pin, metal pillar, solder bump, combinations of these, or other vertical conductive interconnect structures) that extends through opening 64 to positive antenna feed terminal 62V on patch element 58. Radio-frequency transmission line 42H may include a vertical conductor that extends through opening 66 to positive antenna feed terminal 62H on patch element 58. This example is merely illustrative and, if desired, other transmission line structures may be used (e.g., coaxial cable structures, stripline transmission line structures, etc.).

When using the first antenna feed associated with port P1, antenna 40 may transmit and/or receive radio-frequency signals having a first polarization (e.g., the electric field E1 of radio-frequency signals 70 associated with port P1 may be oriented parallel to the B-axis in FIG. 5). When using the antenna feed associated with port P2, antenna 40 may transmit and/or receive radio-frequency signals having a second polarization (e.g., the electric field E2 of radio-frequency signals 70 associated with port P2 may be oriented parallel to the A-axis of FIG. 5 so that the polarizations associated with ports P1 and P2 are orthogonal to each other).

One of ports P1 and P2 may be used at a given time so that antenna 40 operates as a single-polarization antenna or both ports may be operated at the same time so that antenna 40 operates with other polarizations (e.g., as a dual-polarization antenna, a circularly-polarized antenna, an elliptically-polarized antenna, etc.). If desired, the active port may be changed over time so that antenna 40 can switch between covering vertical or horizontal polarizations at a given time. Ports P1 and P2 may be coupled to different phase and magnitude controllers 50 (FIG. 3) or may both be coupled to the same phase and magnitude controller 50. If desired, ports P1 and P2 may both be operated with the same phase and magnitude at a given time (e.g., when antenna 40 acts as a dual-polarization antenna). If desired, the phases and magnitudes of radio-frequency signals conveyed over ports P1 and P2 may be controlled separately and varied over time so that antenna 40 exhibits other polarizations (e.g., circular or elliptical polarizations).

If care is not taken, antennas 40 such as dual-polarization patch antennas of the type shown in FIG. 5 may have insufficient bandwidth for covering relatively wide ranges of frequencies. It may be desirable for antenna 40 to be able to cover both a first frequency band and a second frequency band at frequencies higher than the first frequency band. In one suitable arrangement that is described herein as an example, the first frequency band may include frequencies from about 24-30 GHz whereas the second frequency band includes frequencies from about 37-40 GHz. In these scenarios, patch element 58 may not exhibit sufficient bandwidth on its own to cover an entirety of both the first and second frequency bands.

If desired, antenna 40 may include one or more additional patch elements 60 that are stacked over patch element 58. Each patch element 60 may partially or completely overlap patch element 58. The lower-most patch element 60 may be separated from patch element 58 by distance D, which is selected to provide antenna 40 with a desired bandwidth without occupying excessive volume within device 10. Patch elements 60 may have sides with lengths other than length 68, which configure patch elements 60 to radiate at different frequencies than patch element 58, thereby extending the overall bandwidth of antenna 40.

Patch elements 60 may include directly-fed patch antenna resonating elements (e.g., patch elements with one or more positive antenna feed terminals directly coupled to transmission lines) and/or parasitic antenna resonating elements that are not directly fed by antenna feed terminals and transmission lines. One or more patch elements 60 may be coupled to patch element 58 by one or more conductive through vias if desired (e.g., so that at least one patch element 60 and patch element 58 are coupled together as a single directly fed resonating element). In scenarios where patch elements 60 are directly fed, patch elements 60 may include two positive antenna feed terminals for conveying signals with different (e.g., orthogonal) polarizations and/or may include a single positive antenna feed terminal for conveying signals with a single polarization. The combined resonance of patch element 58 and each of patch elements 60 may configure antenna 40 to radiate with satisfactory antenna efficiency across an entirety of both the first and second frequency bands (e.g., from 24-30 GHz and from 37-40 GHz). The example of FIG. 5 is merely illustrative. Patch elements 60 may be omitted if desired. Patch elements 60 may be rectangular, square, cross-shaped, or any other desired shape having any desired number of straight and/or curved edges. Patch element 60 may be provided at any desired orientation relative to patch element 58. Antenna 40 may have any desired number of feeds. Other antenna types may be used if desired (e.g., dipole antennas, monopole antennas, slot antennas, etc.).

Figure 6:
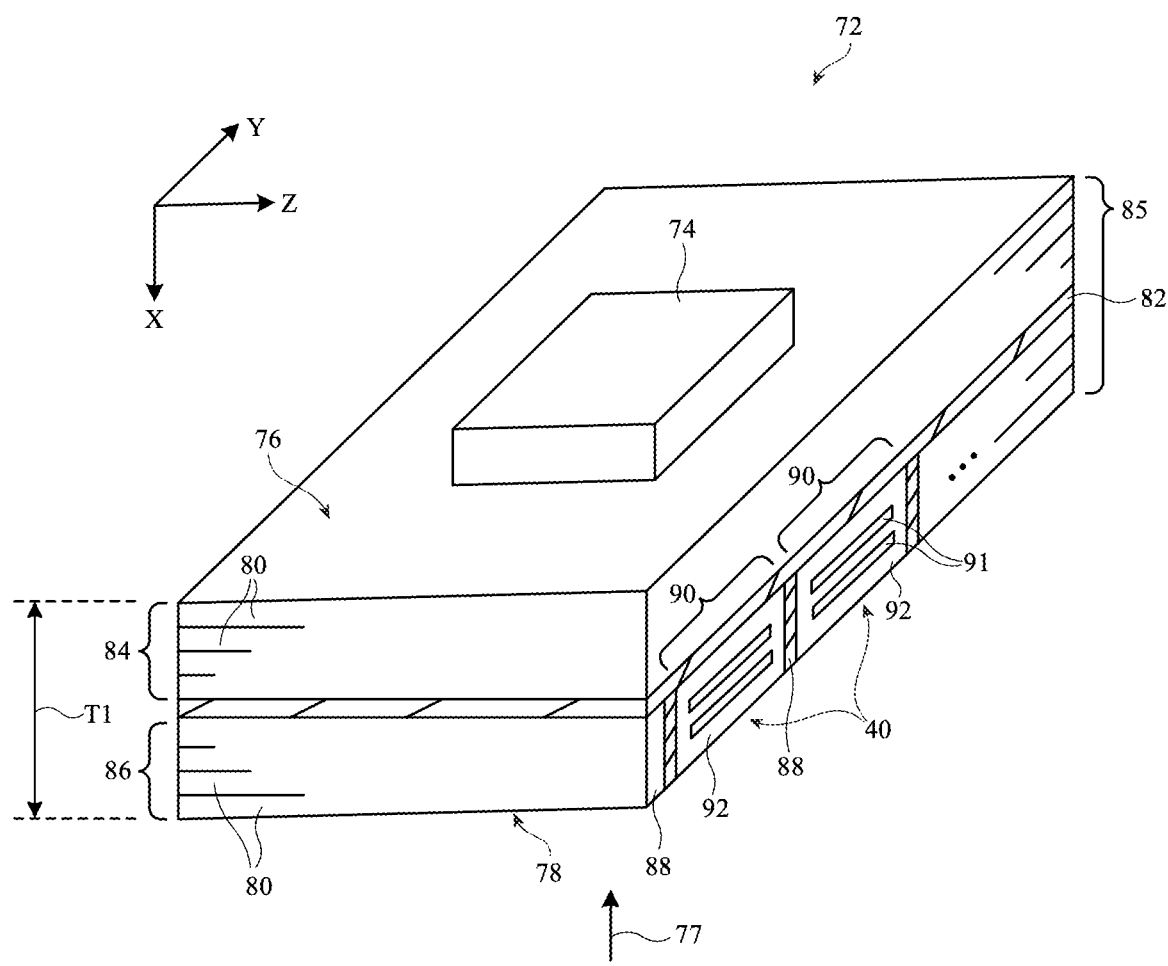
FIG. 6 is a perspective view of an illustrative antenna module in accordance with some embodiments.

If desired, phased antenna array 54 may be integrated with other circuitry such as a radio-frequency integrated circuit to form an integrated antenna module. FIG. 6 is a rear perspective view of an illustrative integrated antenna module for handling signals at frequencies greater than 10 GHz in device 10. As shown in FIG. 6, device 10 may be provided with an integrated antenna module such as integrated antenna module 72 (sometimes referred to herein as antenna module 72 or module 72).

Antenna module 72 may include phased antenna array 54 of antennas 40 formed on a dielectric substrate such as substrate 85. Substrate 85 may be, for example, a rigid printed circuit board. Substrate 85 may be a stacked dielectric substrate that includes multiple stacked dielectric layers 80 (e.g., multiple layers of printed circuit board substrate such as multiple layers of fiberglass-filled epoxy, rigid printed circuit board material, ceramic, plastic, glass, or other dielectrics). Phased antenna array 54 may include any desired number of antennas 40 arranged in any desired pattern.

Antennas 40 in phased antenna array 54 may include antenna elements such as patch elements 91 (e.g., patch elements 91 may form patch element 58 and/or one or more patch elements 60 of FIG. 5). Ground traces 82 may be patterned onto substrate 85 (e.g., conductive traces forming antenna ground 56 of FIG. 5 for each of the antennas 40 in phased antenna array 54). Patch elements 91 may be patterned on (bottom) surface 78 of substrate 85 or may be embedded within dielectric layers 80 at or adjacent to surface 78. Only two patch elements 91 are shown in FIG. 6 for the sake of clarity. This is merely illustrative and, in general, antennas 40 may include any desired number of patch elements 91.

One or more electrical components 74 may be mounted on (top) surface 76 of substrate 85 (e.g., the surface of substrate 85 opposite surface 78 and patch elements 91). Component 74 may, for example, include an integrated circuit (e.g., an integrated circuit chip) or other circuitry mounted to surface 76 of substrate 85. Component 74 may include radio-frequency components such as amplifier circuitry, phase shifter circuitry (e.g., phase and magnitude controllers 50 of FIG. 4), and/or other circuitry that operates on radio-frequency signals. Component 74 may sometimes be referred to herein as radio-frequency integrated circuit (RFIC) 74. However, this is merely illustrative and, in general, the circuitry of RFIC 74 need not be formed on an integrated circuit. Component 74 may be embedded within a plastic overmold if desired.

The dielectric layers 80 in substrate 85 may include a first set of layers 86 (sometimes referred to herein as antenna layers 86) and a second set of layers 84 (sometimes referred to herein as transmission line layers 84). Ground traces 82 may separate antenna layers 86 from transmission line layers 84. Conductive traces or other metal layers on transmission line layers 84 may be used in forming transmission line structures such as radio-frequency transmission lines 42 of FIG. 4 (e.g., radio-frequency transmission lines 42V and 42H of FIG. 5). For example, conductive traces on transmission line layers 84 may be used in forming stripline or microstrip transmission lines that are coupled between the antenna feeds for antennas 40 (e.g., over conductive vias extending through antenna layers 86) and RFIC 74 (e.g., over conductive vias extending through transmission line layers 84). A board-to-board connector (not shown) may couple RFIC 74 to the baseband and/or transceiver circuitry for phased antenna array 54 (e.g., millimeter/centimeter wave transceiver circuitry 38 of FIG. 3).

If desired, each antenna 40 in phased antenna array 54 may be laterally surrounded by fences of conductive vias 88 (e.g., conductive vias extending parallel to the X-axis and through antenna layers 86 of FIG. 6). The fences of conductive vias 88 for phased antenna array 54 may be shorted to ground traces 82 so that the fences of conductive vias 88 are held at a ground potential. Conductive vias 88 may extend downwards to surface 78 or to the same dielectric layer 80 as the bottom-most conductive patch 91 in phased antenna array 54.

The fences of conductive vias 88 may be opaque at the frequencies covered by antennas 40. Each antenna 40 may lie within a respective antenna cavity 92 having conductive cavity walls defined by a corresponding set of fences of conductive vias 88 in antenna layers 86. The fences of conductive vias 88 may help to ensure that each antenna 40 in phased antenna array 54 is suitably isolated, for example. Phased antenna array 54 may include a number of antenna unit cells 90. Each antenna unit cell 90 may include respective fences of conductive vias 88, a respective antenna cavity 92 defined by (e.g., laterally surrounded by) those fences of conductive vias, and a respective antenna 40 (e.g., set of patch elements 91) within that antenna cavity 92. Conductive vias 88 may be omitted if desired.

When implemented as a printed circuit board, substrate 85 may include as many sixteen or more dielectric layers 80. This may configure antenna module 72 to exhibit a relatively large thickness T1 (e.g., measured parallel to the X-axis). Thickness T1 may be too wide to satisfactorily fit into certain portions of device 10, such as in scenarios where antenna module 72 is used to radiate through peripheral conductive housing structures 12W (FIG. 1).

Figure 7:
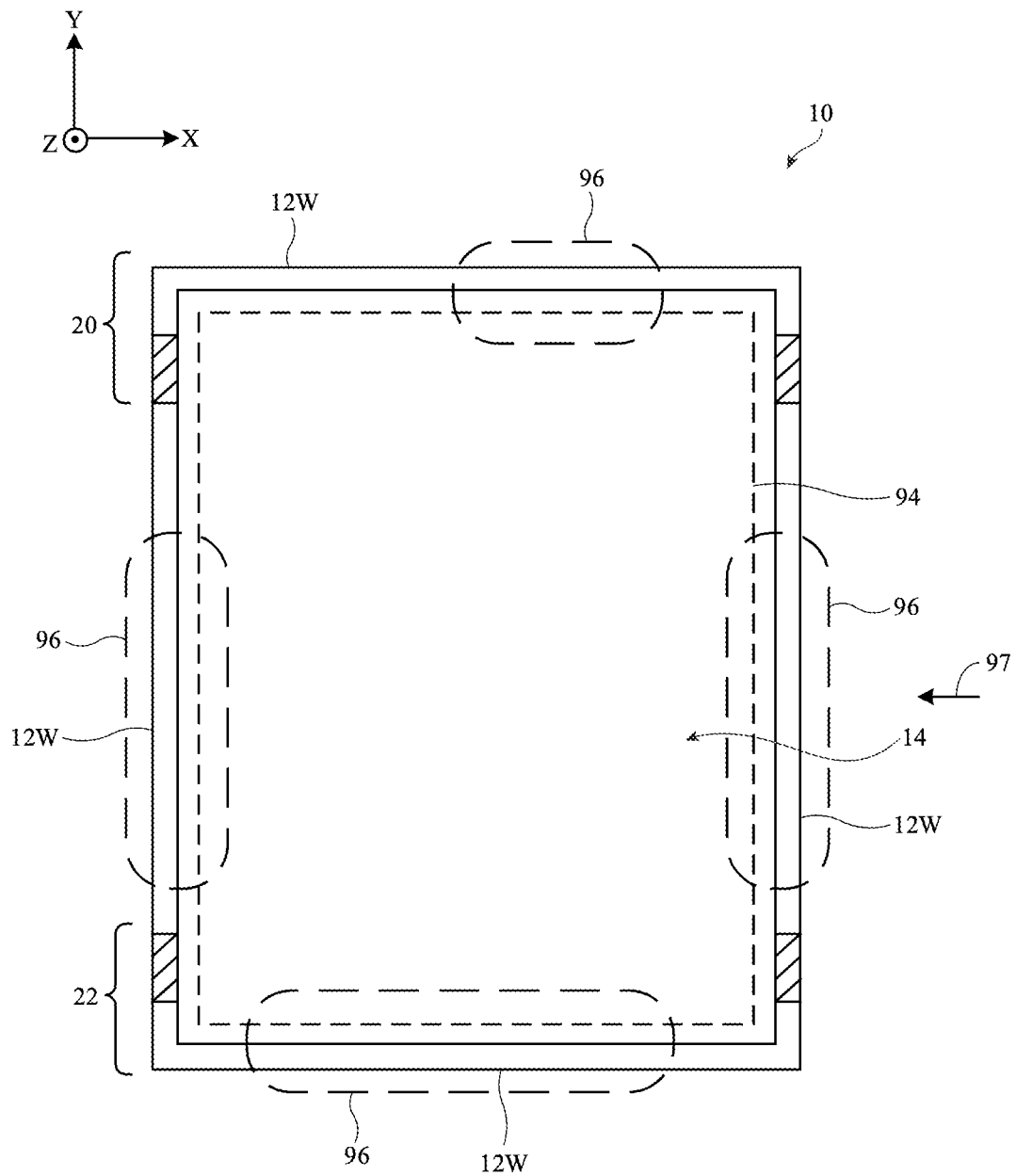
FIG. 7 is a front view of an illustrative electronic device showing exemplary locations for mounting an antenna module that radiates through peripheral conductive housing structures in accordance with some embodiments.

FIG. 7 is a top view of device 10 showing different illustrative locations for positioning antenna module 72 to convey radio-frequency signals through peripheral conductive housing structures 12W of device 10. As shown in FIG. 7, device 10 may include peripheral conductive housing structures 12W (e.g., four peripheral conductive housing sidewalls that surround the rectangular periphery of device 10). In other words, device 10 may have a length (parallel to the Y-axis), a width that is less than the length (parallel to the X-axis), and a height that is less than the width (parallel to the Z-axis). Peripheral conductive housing structures 12W may extend across the length and the width of device 10 (e.g., peripheral conductive housing structures 12W may include a first conductive sidewall extending along the left edge of device 10, a second conductive sidewall extending along the top edge of device 10, a third conductive sidewall extending along the right edge of device 10, and a fourth conductive sidewall extending along the bottom edge of device 10). Peripheral conductive housing structures 12W may also extend across the height of device 10 (e.g., as shown in the perspective view of FIG. 1).

As shown in FIG. 7, display 14 may have a display module such as display module 94. Peripheral conductive housing structures 12W may run around the periphery of display module 94 (e.g., along all four sides of device 10). Display module 94 may be covered by a display cover layer (not shown). The display cover layer may extend across the entire length and width of device 10 and may, if desired, be mounted to or otherwise supported by peripheral conductive housing structures 12W.

Display module 94 (sometimes referred to as a display panel, active display circuitry, or active display structures) may be any desired type of display panel and may include pixels formed from light-emitting diodes (LEDs), organic LEDs (OLEDs), plasma cells, electrowetting pixels, electrophoretic pixels, liquid crystal display (LCD) components, or other suitable pixel structures. The lateral area of display module 94 may, for example, determine the size of the active area of display 14 (e.g., active area AA of FIG. 1). Display module 94 may include active light emitting components, touch sensor components (e.g., touch sensor electrodes), force sensor components, and/or other active components. Because display module 94 includes conductive components, display module 94 may block radio-frequency signals from passing through display 14. Antenna module 72 of FIG. 6 may therefore be located within regions 96 around the periphery of display module 94 and device 10. One or more regions 96 of FIG. 7 may, for example, include a corresponding antenna module 72. Apertures may be formed within peripheral conductive housing structures 12W within regions 96 to allow the antennas in antenna module 72 to convey radio-frequency signals to and/or from the exterior of device 10 (e.g., through the apertures).

In the example of FIG. 7, each region 96 is located along a respective side (edge) of device 10 (e.g., along the top conductive sidewall of device 10 within region 20, along the bottom conductive sidewall of device 10 within region 22, along the left conductive sidewall of device 10, and along the right conductive sidewall of device 10). Antennas mounted in these regions may provide millimeter and centimeter wave communications coverage for device 10 around the lateral periphery of device 10. When combined with the contribution of antennas that radiate through the front and/or rear faces of device 10, the antennas in device 10 may provide a full sphere of millimeter/centimeter wave coverage around device 10. The example of FIG. 7 is merely illustrative. Each edge of device 10 may include multiple regions 96 and some edges of device 10 may include no regions 96. If desired, additional regions 96 may be located elsewhere on device 10.

Figure 8:
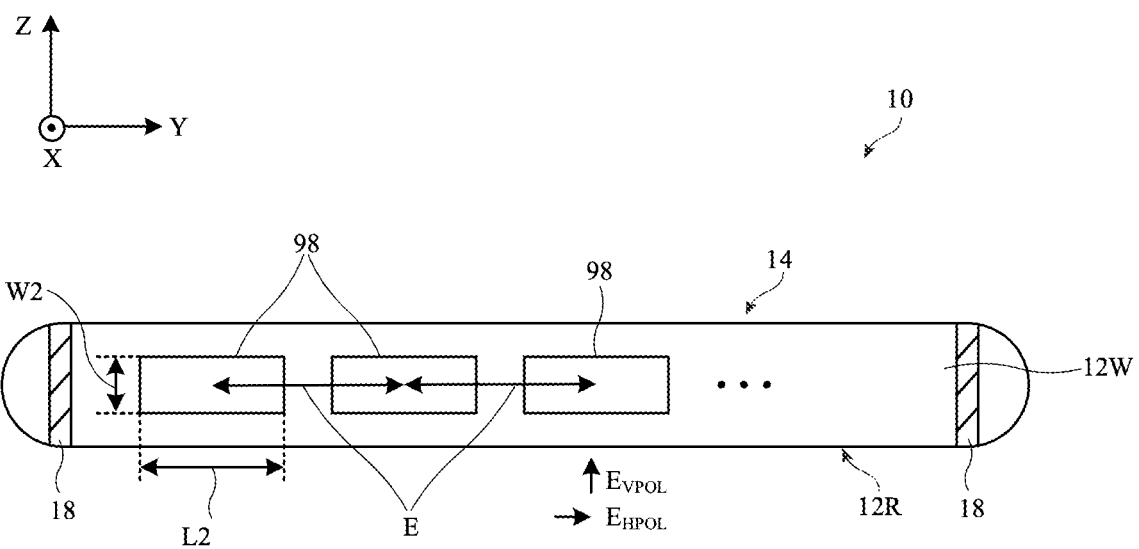
FIG. 8 is a side view of an illustrative electronic device having peripheral conductive housing structures with apertures that are aligned with antennas in an antenna module in accordance with some embodiments.

FIG. 8 is a side view showing how apertures may be formed in peripheral conductive housing structures 12W to allow the antennas in antenna module 72 to convey radio-frequency signals to and/or from the exterior of device 10 (within a given region 96 of FIG. 7). The example of FIG. 8 illustrates apertures that may be formed in the right-most region 96 of FIG. 7 (e.g., along the right conductive sidewall as viewed in the direction of arrow 97 of FIG. 7). Similar apertures may be formed in any desired conductive sidewall of device 10.

As shown in FIG. 8, device 10 may have a first (front) face defined by display 14 and a second (rear) face defined by rear housing wall 12R. Display 14 may be mounted to peripheral conductive structures 12W, which extend from the rear face to the front face and around the periphery of device 10. One or more gaps 18 may extend from the rear face to the front face to divide peripheral conductive housing structures 12W into different segments.

One or more antenna apertures such as apertures 98 may be formed in peripheral conductive housing structures 12W. Apertures 98 (sometimes referred to herein as slots 98) may be filled with one or more dielectric materials and may have edges that are defined by the conductive material in peripheral conductive housing structures 12W. Antenna module 72 of FIG. 6 may be mounted within the interior of device 10 (e.g., with the antennas facing apertures 98). Each aperture 98 may be aligned with a respective antenna 40 in the antenna module. The center of each aperture 98 may therefore be separated from the center of one or two adjacent apertures 98 by distance E.

In addition to allowing radio-frequency signals to pass between the antenna module and the exterior of device 10, apertures 98 may also form waveguide radiators for the antennas in the antenna module. For example, the radio-frequency signals conveyed by the antennas may excite one or more electromagnetic waveguide (cavity) modes within apertures 98, which contribute to the overall resonance and frequency response of the antennas in the antenna module.

Apertures 98 may have any desired shape. In the example of FIG. 8, apertures 98 are rectangular. Each aperture 98 may have a corresponding length L2 and width W2. Length L2 and width W2 may be selected establish resonant cavity modes within apertures 98 (e.g., electromagnetic waveguide modes that contribute to the radiative response of antennas 40). Length L2 may, for example, be selected to establish a horizontally-polarized resonant cavity mode for aperture 98 and width W2 may be selected to establish a vertically-polarized resonant cavity mode for aperture 98.

At the same time, if care is not taken, impedance discontinuities between the antennas in the antenna module and free space at the exterior of device 10 may introduce undesirable signal reflections and losses that limits the overall gain and efficiency for the antennas. Apertures 98 may therefore also serve as an impedance transition between the antenna module and free space at the exterior of device 10 that is free from undesirable impedance discontinuities.

In scenarios where antennas 40 include dual-polarization antennas (e.g., with at least two antenna feeds as shown in FIG. 5), the radio-frequency signals propagating through and exciting apertures 98 may be subjected to different impedance loading depending on whether the signals are horizontally or vertically polarized. For example, vertically polarized signals (e.g., signals having an electric field vector $E_{VPOL}$ oriented parallel to the Z-axis) may be subjected to a first amount of impedance loading whereas horizontally polarized signals (e.g., signals having an electric field vector $E_{HPOL}$ oriented parallel to the Y-axis) are subjected to a second amount of impedance loading during excitation of and propagation through apertures 98.

In order to mitigate this differential impedance loading, length L2 may be selected to be greater than width W2. This may serve to match the vertically polarized resonant mode of apertures 98 to the vertically polarized resonant mode of antennas 40 while also matching the horizontally polarized resonant mode of apertures 98 to the vertically polarized resonant mode of antennas 40. This may help to establish a smooth impedance transition from the antenna module to free space at the exterior of device 10 for both the horizontally and vertically polarized signals. This example is merely illustrative and, in general, apertures 98 may have any desired shape.

In scenarios where antenna module 72 of FIG. 6 is formed from dielectric substrate 85 (i.e., a rigid printed circuit board), the thickness T1 of antenna module 72 may be too large to satisfactorily fit within region 96 of FIG. 7 (e.g., without protruding too far into the interior of device 10). This may also prevent other device components from being disposed at or adjacent to region 96, may limit the size of the display's active area, may prevent reduction in the thickness of device 10, etc. In order to minimize the thickness of antenna module 72 for radiating through apertures 98 in peripheral conductive housing structures 12W, the antenna structures in antenna module 72 may be distributed across multiple portions of a folded flexible printed circuit.

Figure 9:
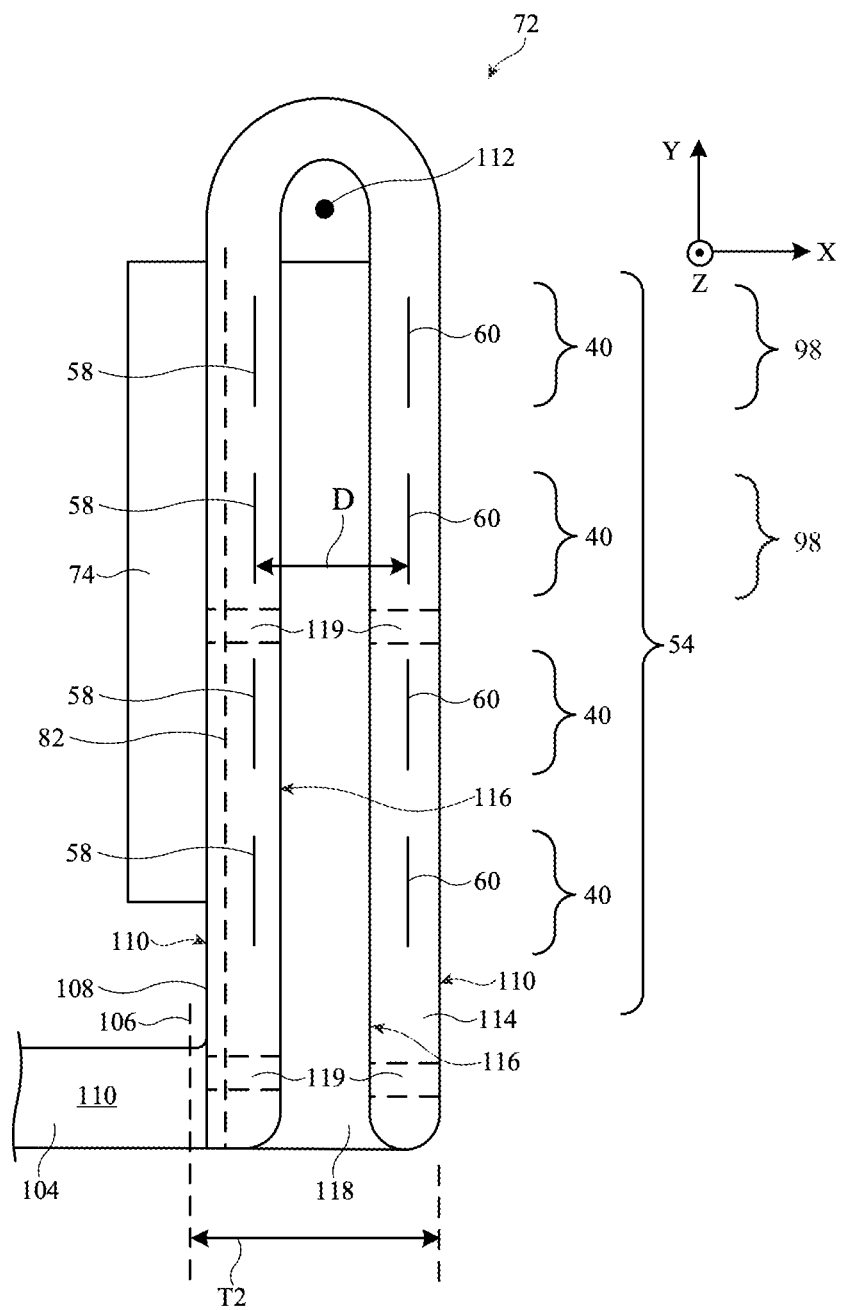
FIG. 9 is a cross-sectional top view of an illustrative antenna module formed from a folded flexible printed circuit in accordance with some embodiments.

FIG. 9 is a cross-sectional top view showing one example of how the antenna structures in antenna module 72 may be distributed across multiple portions of a folded flexible printed circuit. Antenna module 72 of FIG. 9 may include a flexible printed circuit instead of dielectric substrate 85 of FIG. 6. As shown in FIG. 9, the flexible printed circuit in antenna module 72 may have a portion 104, a portion 108, and a portion 114 (sometimes also referred to herein as regions of the flexible printed circuit, flexible printed circuit portions, or flexible printed circuit regions). Flexible printed circuit portion 108 may be folded upwards with respect to flexible printed circuit portion 104 about axis 106 (e.g., an axis running parallel to the Y-axis). Flexible printed circuit portion 114 may extend from an end of flexible printed circuit portion 108 and may be folded with respect to flexible printed circuit portion 108 around/about axis 112 (e.g., an axis running parallel to the Z-axis), such that flexible printed circuit portion 114 overlaps flexible printed circuit portion 108 despite being laterally offset from flexible printed circuit portion 108 when the flexible printed circuit is unfolded.

When unfolded, the flexible printed circuit may have a first lateral surface 110 (e.g., a lateral surface facing upwards in the plane of the page) and a second lateral surface 116 opposite first lateral surface 110 (e.g., a lateral surface facing downwards in the plane of the page). When folded, a layer of adhesive such as adhesive 118 may be interposed between flexible printed circuit portion 108 and flexible printed circuit portion 114. Adhesive 118 may be pressure sensitive adhesive, as one example. Adhesive 118 may adhere, affix, or secure flexible printed circuit portion 108 to flexible printed circuit portion 114, thereby helping the flexible printed circuit to maintain its folded shape.

If desired, component 74 may be mounted to surface 110 (e.g., on flexible printed circuit portion 108). Flexible printed circuit portion 104 may couple flexible printed circuit portion 108 to other components in device 10 (e.g., a main logic board or other printed circuit board, radio-frequency transceiver circuitry, etc.). Component 74 may be coupled to other circuitry in device 10 (e.g., intermediate frequency circuitry, radio-frequency transceiver circuitry, baseband circuitry, etc.) over conductive paths that pass through flexible printed circuit portion 104 (e.g., baseband paths, intermediate frequency paths, radio-frequency transmission lines, etc.). Component 74 may be omitted if desired. The flexible printed circuit in antenna module 72 may include multiple stacked layers of flexible printed circuit material (e.g., polyimide layers). There may be fewer layers in the flexible printed circuit of FIG. 9 than in the rigid printed circuit board of FIG. 6. Conductive traces may be patterned on the layers of the flexible printed circuit to form phased antenna array 54. For example, phased antenna array 54 may be formed from conductive traces within flexible printed circuit portions 108 and 114. The conductive layers in each antenna 40 of phased antenna array 54 may be distributed between/across second flexible printed circuit portion 108 and third flexible printed circuit portion 114.

In the example of FIG. 9, the ground traces 82 and patch elements 58 in each antenna 40 of phased antenna array 54 are disposed in flexible printed circuit portion 108, whereas the patch element 60 in each antenna 40 of phased antenna array 54 is disposed in flexible printed circuit portion 114. Ground traces 82 and patch elements 58 may be embedded within the layers of flexible printed circuit portion 108 or may be patterned on outermost layers of flexible printed circuit portion 108 (e.g., ground traces 82 may be patterned onto lateral surface 110 and/or patch elements 58 may be patterned onto lateral surface 116 of flexible printed circuit portion 108). Similarly, patch elements 60 may be embedded within the layers of flexible printed circuit portion 114 or may be patterned on an outermost layer of flexible printed circuit portion 114 (e.g., on lateral surface 110 or lateral surface 116 of flexible printed circuit portion 114). When the flexible printed circuit in antenna module 72 is folded, adhesive 118 may ensure that distance D is maintained between the patch element 58 and the patch element 60 in each antenna 40 of phased antenna array 54.

During manufacture of antenna module 72, ground traces 82 and patch elements 58 may be patterned onto the layers of flexible printed circuit portion 108 while the flexible printed circuit is unfolded. Similarly, patch elements 60 may be patterned onto a layer of flexible printed circuit portion 114 while the flexible printed circuit is unfolded. Patch elements 60 may therefore be laterally offset from patch elements 58 on the flexible printed circuit while unfolded. Radio-frequency transmission lines may also be patterned onto flexible printed circuit portion 108 (e.g., to couple patch elements 58 to radio-frequency transceiver circuitry in component 74 or elsewhere in device 10). Conductive vias may be formed in flexible printed circuit portion 108 to couple the radio-frequency transmission lines to component 74 and to positive antenna feed terminals on patch elements 58. If desired, fences of grounded conductive vias and/or additional ground traces may be laterally interposed between each patch element 58 in flexible printed circuit portion 108 and/or between each patch element 60 in flexible printed circuit portion 114.

Folding the flexible printed circuit about axis 112 may serve to align each patch element 60 in flexible printed circuit portion 114 to a corresponding patch element 58 in flexible printed circuit portion 108. If desired, alignment structures such as alignment structures 119 may be formed at one or more locations in flexible printed circuit portion 114 and/or flexible printed circuit portion 108 to help ensure that each patch element 60 is precisely aligned to a corresponding patch element 58 during folding. Alignment structures 119 may include alignment notches or alignment holes in the flexible printed circuit, alignment pins extending through the alignment notches or alignment holes, and/or any other desired alignment structures. Once folded, adhesive 118 may ensure that patch elements 58 and 60 remain in precise lateral alignment over time (e.g., as viewed within the Y-Z plane of FIG. 9).

By distributing each antenna 40 in phased antenna array 54 across different regions of the flexible printed circuit (e.g., flexible printed circuit portions 108 and 114) and then folding the flexible printed circuit as shown in FIG. 9, antenna module 72 may exhibit a thickness T2 that is significantly less than thickness T1 of FIG. 6 (e.g., thickness T2 may be at least 1-2 mm less than thickness T1). This may allow antenna module 72 to more easily fit within region 96 of FIG. 7 for radiating through apertures 98 in peripheral conductive housing structures 12W of FIG. 8.

In the example of FIG. 9, phased antenna array 54 is a four-by-one array with four antennas 40 arranged in a single row. This is merely illustrative. Phased antenna array 54 may include any desired number of antennas 40 arranged in any desired one or two-dimensional array pattern. In examples where patch elements 60 are directly fed, radio-frequency transmission lines for patch elements 60 may pass around axis 112 and into flexible printed circuit portion 114 and/or conductive vias may be used to feed patch elements 60. In another implementation, ground traces 82 are formed in flexible printed circuit portion 108 whereas patch elements 58 and patch elements 60 are formed in flexible printed circuit portion 114. In another implementation, ground traces 82 are formed in flexible printed circuit portion 108, patch elements 58 are formed in flexible printed circuit portion 114, and patch elements 60 are omitted. In another implementation, multiple patch elements 60 are formed in flexible printed circuit portion 114 for each antenna (e.g., in scenarios where antennas 40 include multiple stacked patch elements 60). In another implementation, ground traces 82, patch element 58, and a first patch element 60 in each antenna 40 are formed in flexible printed circuit portion 108 whereas a second patch element 60 and optionally additional patch elements 60 in each antenna 40 are formed in flexible printed circuit portion 114. The example of FIG. 9 in which antennas 40 are stacked patch antennas is merely illustrative and, in general, antennas 40 may be formed using any desired antenna structures that are distributed between flexible printed circuit portions 108 and 114.

Figure 10:
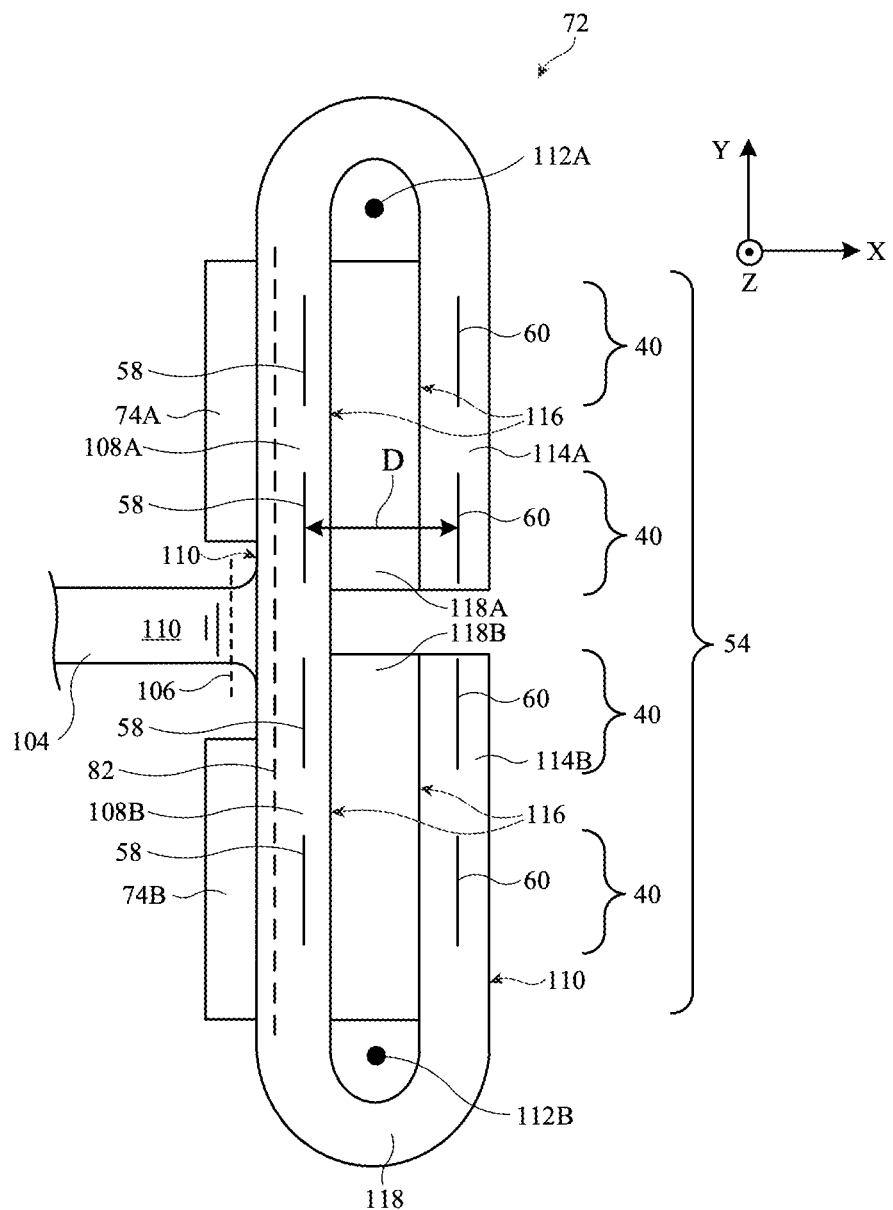
FIG. 10 is a cross-sectional top view of an illustrative antenna module formed from a flexible printed circuit with multiple folded branches in accordance with some embodiments.

In the example of FIG. 9, the flexible printed circuit in antenna module 72 includes a single branch that is folded around axis 112. If desired, the flexible printed circuit in antenna module 72 may include multiple folded branches. FIG. 10 is a cross-sectional top view showing how the flexible printed circuit in antenna module 72 may include multiple folded branches. As shown in FIG. 10, the flexible printed circuit may include a first branch that includes flexible printed circuit portions 108A and 114A and a second branch that includes flexible printed circuit portions 108B and 114B.

The first and second branches (e.g., flexible printed circuit portions 108A and 108B) may be folded upwards about axis 106 with respect to flexible printed circuit portion 104 and may extend from opposing sides of flexible printed circuit portion 104. Flexible printed circuit portion 114A may extend from an end of flexible printed circuit portion 108A and may be folded about axis 112A with respect to flexible printed circuit portion 108A, such that flexible printed circuit portion 114A overlaps flexible printed circuit portion 108A despite being laterally offset from flexible printed circuit portion 108A when unfolded. Axis 112A may extend parallel to axis 112B and the Z-axis of FIG. 10. Flexible printed circuit portion 114B may extend from an end of flexible printed circuit portion 108B and may be folded about axis 112B with respect to flexible printed circuit portion 108B, such that flexible printed circuit portion 114B overlaps flexible printed circuit portion 108B despite being laterally offset from flexible printed circuit portion 108B when unfolded. The tip of flexible printed circuit portion 114A may face the tip of flexible printed circuit portion 114B.

A first set of the antennas 40 in phased antenna array 54 may be distributed between flexible printed circuit portions 108A and 114A (e.g., as described above in connection with flexible printed circuit portions 108 and 114 of FIG. 9). Similarly, a second set of the antennas 40 in phased antenna array 54 may be distributed between flexible printed circuit portions 108B and 114B (e.g., as described above in connection with flexible printed circuit portions 108 and 114 of FIG. 9). There may be the same number of antennas 40 in the first and second sets or there may be a different number of antennas 40 in the first set than in the second set. Component 74A may be mounted to flexible printed circuit portion 108A and/or component 74B may be mounted to flexible printed circuit portion 108B if desired. Component 74A may include radio-frequency components for the antennas 40 in flexible printed circuit portions 108A and 114A whereas component 74B may include radio-frequency components for the antennas 40 in flexible printed circuit portions 108B and 114B, for example.

A layer of adhesive such as adhesive 118A (e.g., pressure sensitive adhesive) may be interposed between flexible printed circuit portions 108A and 114A. Adhesive 118A may ensure that the patch elements for each antenna 40 are laterally aligned between flexible printed circuit portions 108A and 114A while also ensuring that the patch elements in flexible printed circuit portion 108A are separated from a corresponding patch element in flexible printed circuit portion 114A by distance D. Similarly, a layer of adhesive such as adhesive 118B (e.g., pressure sensitive adhesive) may be interposed between flexible printed circuit portions 108B and 114B. Adhesive 118B may ensure that the patch elements for each antenna 40 are laterally aligned between flexible printed circuit portions 108B and 114B while also ensuring that the patch elements in flexible printed circuit portion 108B are separated from a corresponding patch element in flexible printed circuit portion 114B by distance D.

Distributing the antennas 40 in phased antenna array 54 across multiple branches of the flexible printed circuit in this way may, for example, reduce the routing complexity and density for the radio-frequency transmission lines used by antennas 40 relative to examples where the flexible printed circuit includes only a single branch. The example of FIG. 10 is merely illustrative. Phased antenna array 54 may include any desired number of antennas 40 arranged in any desired one or two-dimensional array pattern. In examples where patch elements 60 are directly fed, radio-frequency transmission lines for patch elements 60 may pass around axes 112A and 112B and into flexible printed circuit portions 114A and 114B and/or conductive vias may be used to feed patch elements 60. In another implementation, ground traces 82 are formed in flexible printed circuit portions 108A and 108B whereas patch elements 58 and patch elements 60 are formed in flexible printed circuit portions 114A and 114B. In another implementation, ground traces 82 are formed in flexible printed circuit portions 108A and 108B, patch elements 58 are formed in flexible printed circuit portions 114A and 114B, and patch elements 60 are omitted. In another implementation, multiple patch elements 60 for each antenna 40 are formed in flexible printed circuit portions 114A and 114B (e.g., in scenarios where antennas 40 include multiple stacked patch elements 60). In another implementation, ground traces 82, patch element 58, and a first patch element 60 in each antenna 40 are formed in flexible printed circuit portions 108A and 108B whereas a second patch element 60 and optionally additional patch elements 60 in each antenna 40 are formed in flexible printed circuit portions 114A and 114B. The example of FIG. 10 in which antennas 40 are stacked patch antennas is merely illustrative and, in general, antennas 40 may be formed using any desired antenna structures that are distributed between flexible printed circuit portions 108A/108B and 114A/114B.

Figure 11:
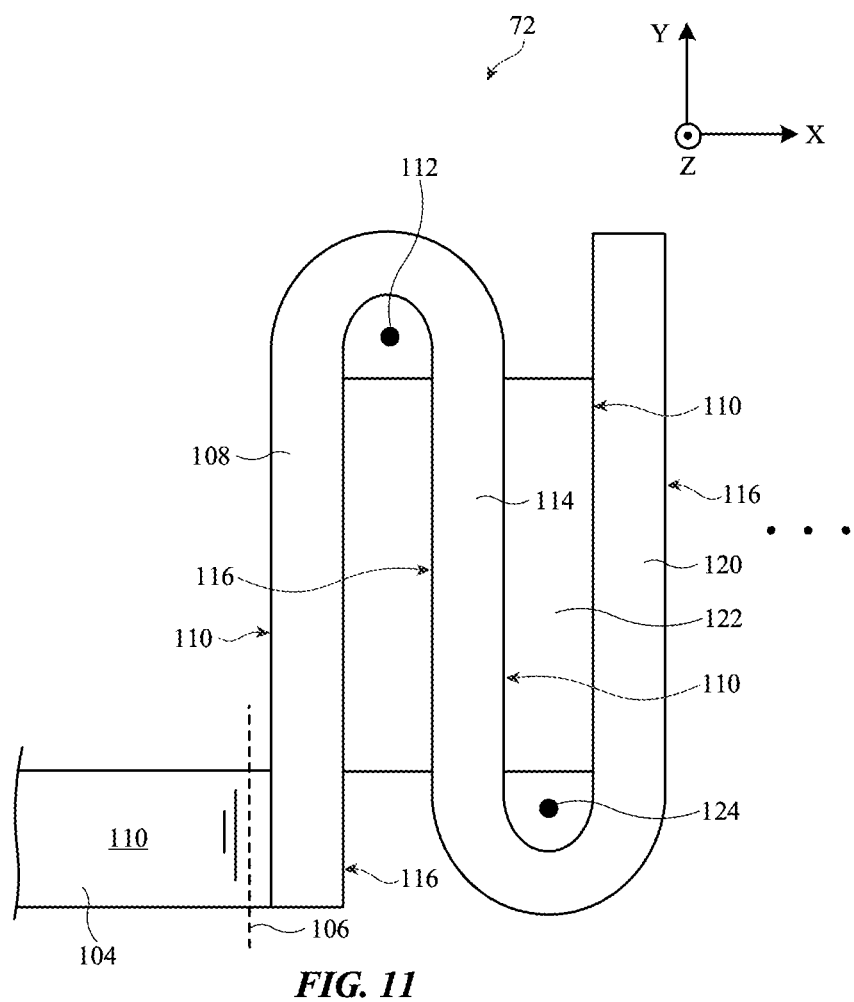
FIG. 11 is a cross-sectional top view of an illustrative antenna module formed from a flexible printed circuit having multiple folds in accordance with some embodiments.

The examples of FIGS. 9 and 10 are merely illustrative. If desired, the flexible printed circuit in antenna module 72 may include additional folds. FIG. 11 is a cross-sectional top view showing one example of how the flexible printed circuit in antenna module 72 may include additional folds. The folding arrangement of FIG. 11 may be used when the flexible printed circuit has a single branch (e.g., as shown in FIG. 9) or may be used for each branch when the flexible printed circuit has multiple branches (e.g., as shown in FIG. 10). Antennas 40 and component 74 have been omitted from FIG. 11 for the sake of clarity.

As shown in FIG. 11, the flexible printed circuit in antenna module 72 may include a flexible printed circuit portion 120 that extends from the end of flexible printed circuit portion 114 (or flexible printed circuit portions 114A or 114B in the arrangement of FIG. 10). Flexible printed circuit portion 120 may be folded about axis 124 with respect to flexible printed circuit portion 114 and may overlap flexible printed circuit portions 108 and 114. Axis 124 may extend parallel to axis 112 and the Z-axis of FIG. 11. A layer of adhesive such as adhesive 122 (e.g., pressure sensitive adhesive) may be interposed between flexible printed circuit portions 114 and 120.

One or more of the conductive layers in antennas 40 may be disposed within flexible printed circuit portion 120 and/or on lateral surfaces 110 or 116 of flexible printed circuit portion 120. For example, ground traces 82 and patch element 58 may be located on flexible printed circuit portion 108 whereas one or more patch elements 60 may be located on flexible printed circuit portion 114 and one or more patch elements 60 may be located on flexible printed circuit portion 120 (e.g., in scenarios where antennas 40 are stacked patch antennas having two or more stacked patch elements 60 as shown in FIG. 5). This is merely illustrative and, in general, the conductive layers of each antenna 40 may be distributed across flexible printed circuit portions 108, 114, and 120 in any desired manner. The flexible printed circuit may have additional flexible printed circuit portions that extend from the end of flexible printed circuit portion 120 and that are folded about additional axes parallel to axes 112 and 124 if desired (e.g., the flexible printed circuit may have any desired number of folds).

Figure 12:
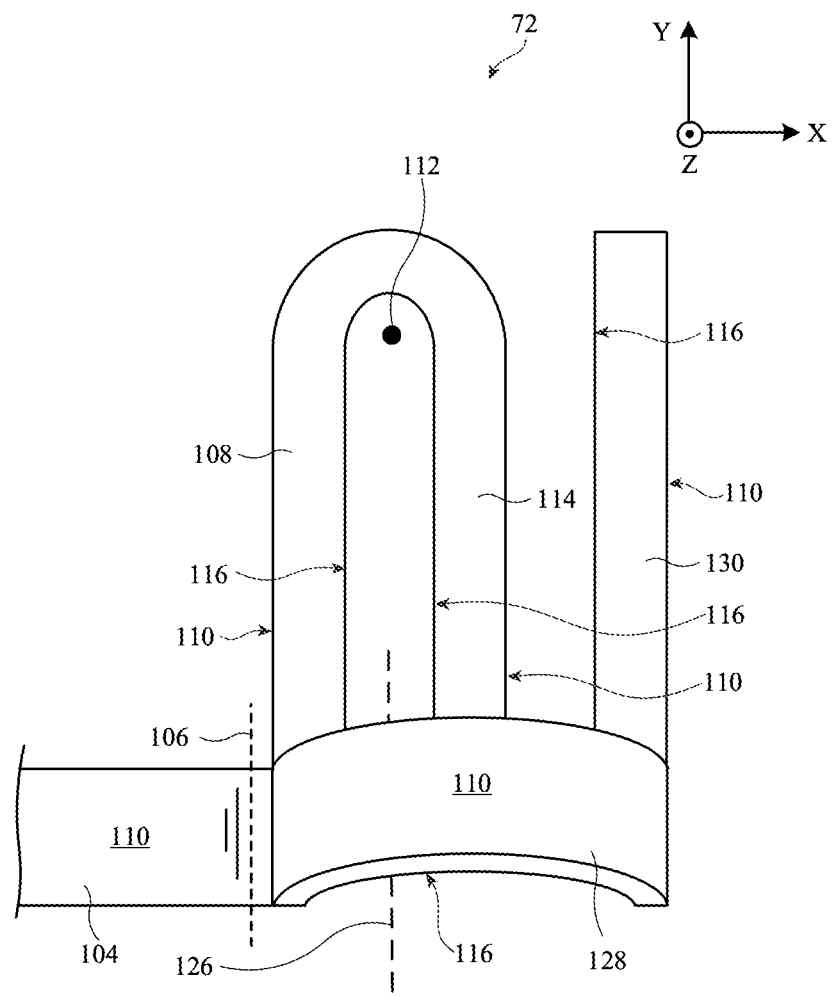
FIG. 12 is a cross-sectional top view of an illustrative antenna module formed from a flexible printed circuit having a folded tab in accordance with some embodiments.

In another implementation, the flexible printed circuit in antenna module 72 may have a folded tab that passes over flexible printed circuit portion 114, as shown in the example of FIG. 12. The layers of adhesive in antenna module 72 have been omitted from FIG. 12 for the sake of clarity. As shown in FIG. 12, the flexible printed circuit may include a folded tab 128 that extends from flexible printed circuit portion 108 and that is wrapped or folded around axis 126 and flexible printed circuit portion 114. The flexible printed circuit may include an additional flexible printed circuit portion 130 that extends from an end of folded tab 128 and parallel to flexible printed circuit portions 108 and 114.

One or more of the conductive layers in antennas 40 may be disposed within flexible printed circuit portion 130 and/or on lateral surfaces 110 or 116 of flexible printed circuit portion 130. For example, ground traces 82 and patch element 58 may be located on flexible printed circuit portion 108 whereas one or more patch elements 60 may be located on flexible printed circuit portion 114 and one or more patch elements 60 may be located on flexible printed circuit portion 130 (e.g., in scenarios where antennas 40 are stacked patch antennas having two or more stacked patch elements 60 as shown in FIG. 5). This is merely illustrative and, in general, the conductive layers of each antenna 40 may be distributed across flexible printed circuit portions 108, 114, and 130 in any desired manner.

The examples of FIGS. 9-12 are merely illustrative. The folding arrangements of FIGS. 9-12 may be combined in any desired manner. Other folding arrangements may be used if desired. In another implementation, flexible printed circuit portion 114A of FIG. 10 may be extended to overlap flexible printed circuit portion 114B and flexible printed circuit portion 114B may be extended to overlap flexible printed circuit portion 114A to provide three overlapping flexible printed circuit portions for distributing the conductive layers of antennas 40. Alignment structures such as alignment structures 119 of FIG. 9 may be provided in the flexible printed circuits of FIGS. 10-12 if desired.

Figure 13:
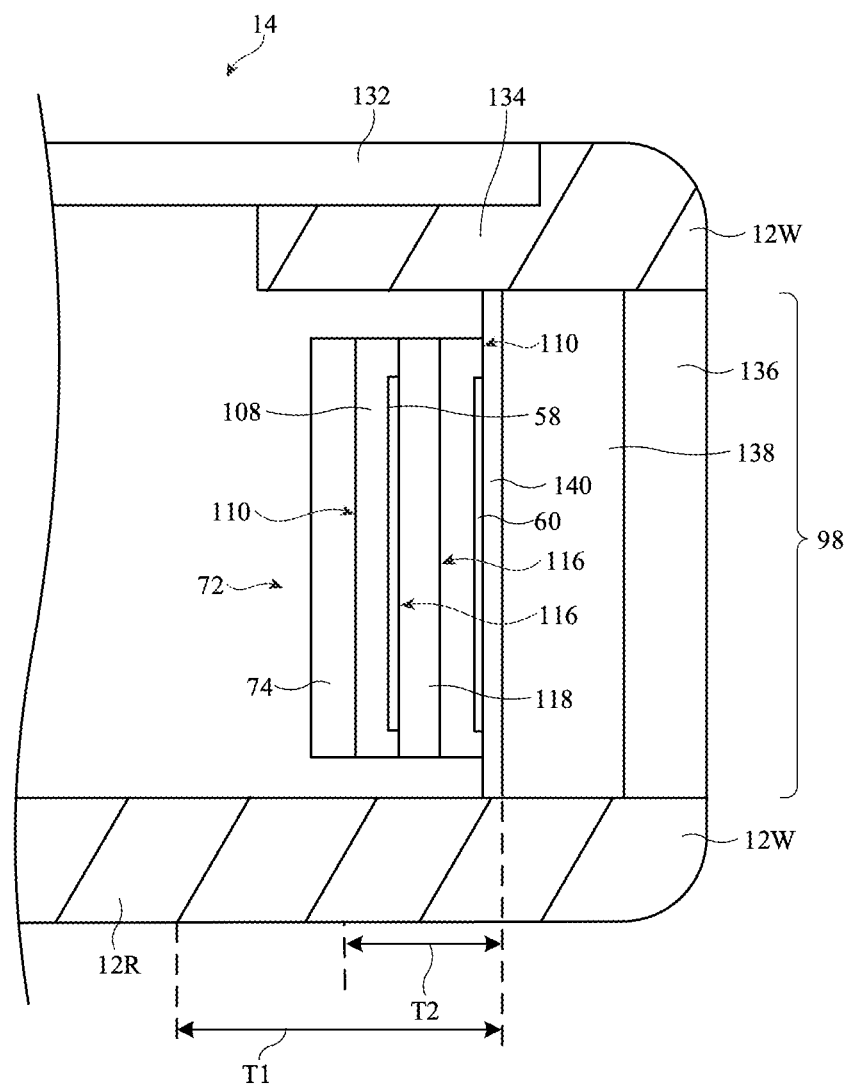
FIG. 13 is a cross-sectional side view showing how an illustrative antenna module of the types shown in FIGS. 9-12 may be mounted within an electronic device for radiating through an aperture in peripheral conductive housing structures in accordance with some embodiments.

FIG. 13 is a cross-sectional side view showing how antenna module 72 of FIGS. 9 and 10 may be mounted within device 10 in alignment with a corresponding aperture 98 in peripheral conductive housing structures 12W (e.g., as taken at the location of a given antenna in the antenna module). As shown in FIG. 13, display 14 may include a display cover layer 132 that is mounted to ledge (datum) 134 of peripheral conductive housing structures 12W. Aperture 98 may be formed in peripheral conductive housing structures 12W. Rear housing wall 12R may extend from peripheral conductive housing structures 12W opposite display cover layer 132.

Aperture 98 may include a cavity formed in peripheral conductive housing structures 12W. A dielectric substrate such as dielectric substrate 138 may be disposed within the cavity. Dielectric substrate 138 may be formed from injection molded plastic, as one example. Flexible printed circuit portion 114 of antenna module 72 may be mounted to dielectric substrate 138 using a layer of adhesive such as adhesive 140. Dielectric cover layer 136 may also be mounted within the cavity. Dielectric cover layer 136 may have an inner surface that contacts dielectric substrate 138. Dielectric cover layer 136 also has an outer surface at the exterior of device 10. The outer surface of dielectric cover layer 136 may, for example, lie flush with exterior surface of peripheral conductive housing structures 12W. Dielectric cover layer 136 may also sometimes be referred to herein as dielectric antenna window 136.

When mounted in this way, patch elements 58 and 60 in antenna module 72 may radiate through aperture 98 and through peripheral conductive housing structures 12W. When the antenna module is formed using a rigid printed circuit board, the thickness of the antenna module (e.g., thickness T1) may be relatively large and may, for example, extend beyond ledge 134 of peripheral conductive housing structures 12W and into the interior of device 10. Distributing the antennas in antenna module 72 across multiple overlapping portions of a folded flexible printed circuit may configure the antenna module 72 to exhibit a thickness T2 that is significantly less than thickness T1 and that does not protrude beyond ledge 134. The example of FIG. 13 is merely illustrative. Antenna module 72 may have additional folds (e.g., as shown in FIGS. 11 and 12). Aperture 98 may have other shapes.

Device 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is merely illustrative and various modifications can be made by those skilled in the art without departing from the scope and spirit of the described embodiments. The foregoing embodiments may be implemented individually or in any combination.

What is claimed is:
1. An electronic device comprising:
   a flexible printed circuit having a first portion and a second portion that extends from an end of the first portion, the second portion being folded about an axis with respect to the first portion; and
   an antenna on the flexible printed circuit and comprising ground traces on the first portion of the flexible printed circuit,
      a first patch on the second portion of the flexible printed circuit and overlapping the ground traces, and
      a second patch on the first portion of the flexible printed circuit and aligned with the first patch on the second portion of the flexible printed circuit, the second patch being interposed between the ground traces and the first patch.
2. The electronic device of claim 1, further comprising a positive antenna feed terminal coupled to the second patch on the first portion of the flexible printed circuit.
3. The electronic device of claim 2, further comprising:
   a radio-frequency integrated circuit mounted to a surface of the first portion of the flexible printed circuit.
4. The electronic device of claim 1, further comprising:
   a layer of adhesive that adheres the first portion of the flexible printed circuit to the second portion of the flexible printed circuit.
5. The electronic device of claim 1, wherein the antenna is configured to radiate at a frequency greater than 10 GHz.
6. The electronic device of claim 1, wherein the flexible printed circuit has a third portion that extends from an end of the second portion, the third portion being folded about an additional axis with respect to the second portion, and the additional axis extending parallel to the axis.
7. The electronic device of claim 6, further comprising:
   a first layer of adhesive that adheres the first portion of the flexible printed circuit to the second portion of the flexible printed circuit; and
   a second layer of adhesive that adheres the second portion of the flexible printed circuit to the third portion of the flexible printed circuit.
8. The electronic device of claim 1, further comprising:
   a housing having peripheral conductive housing structures and a rear housing wall;
   a display mounted to the peripheral conductive housing structures opposite the rear housing wall; and
   an aperture in the peripheral conductive housing structures, wherein the antenna is configured to radiate through the aperture.
9. An electronic device comprising:
   a housing having peripheral conductive housing structures and a housing wall;
   a display mounted to the peripheral conductive housing structures opposite the housing wall;

a first aperture in the peripheral conductive housing structures;
a flexible printed circuit having a first portion and a second portion that extends from an end of the first portion, the second portion being folded about an axis with respect to the first portion;
a first antenna on the flexible printed circuit and configured to radiate through the first aperture, the first antenna comprising
  ground traces on the first portion of the flexible printed circuit, and
  a first patch on the second portion of the flexible printed circuit and overlapping the ground traces;
a second aperture in the peripheral conductive housing structures; and
a second antenna on the flexible printed circuit and configured to radiate through the second aperture, the second antenna comprising
  the ground traces on the first portion of the flexible printed circuit, and
  a second patch on the second portion of the flexible printed circuit and overlapping the ground traces.

10. The electronic device of claim 9, further comprising:
a phased antenna array configured to generate a beam of signals at frequencies greater than 10 GHz, the phased antenna array comprising the first antenna and the second antenna.

11. An electronic device comprising:
a housing having peripheral conductive housing structures and a housing wall;
a display mounted to the peripheral conductive housing structures opposite the housing wall;
an aperture in the peripheral conductive housing structures;
a flexible printed circuit having a first portion and a second portion that extends from an end of the first portion, the second portion being folded about an axis with respect to the first portion;
a first antenna on the flexible printed circuit and configured to radiate through the aperture, the first antenna comprising
  ground traces on the first portion of the flexible printed circuit, and
  a first patch on the second portion of the flexible printed circuit and overlapping the ground traces; and
a second antenna on the flexible printed circuit and configured to radiate through the aperture, the second antenna comprising
  the ground traces on the first portion of the flexible printed circuit, and
  a second patch on the second portion of the flexible printed circuit and overlapping the ground traces.

12. The electronic device of claim 1, further comprising:
a conductive housing wall; and
a dielectric window in the conductive housing wall, wherein the second portion of the flexible printed circuit is pressed against the dielectric window.

* * * * *